(12) United States Patent
Park

(10) Patent No.: US 6,980,479 B2
(45) Date of Patent: Dec. 27, 2005

(54) SEMICONDUCTOR DEVICE FOR DOMAIN CROSSING

(75) Inventor: Nak-Kyu Park, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 61 days.

(21) Appl. No.: 10/748,028

(22) Filed: Dec. 29, 2003

(65) Prior Publication Data

US 2004/0218461 A1    Nov. 4, 2004

(30) Foreign Application Priority Data

Apr. 29, 2003    (KR) .................. 10-2003-0027003

(51) Int. Cl.[7] .................................................. G11C 8/00
(52) U.S. Cl. ...................... 365/233; 365/194; 365/222
(58) Field of Search ............................... 365/233, 194, 365/222, 189.02, 205, 189.05

(56) References Cited

U.S. PATENT DOCUMENTS

| | | | |
|---|---|---|---|
| 6,333,896 B1 | 12/2001 | Lee | |
| 6,476,652 B1 | 11/2002 | Lee et al. | |
| 6,538,956 B2 | 3/2003 | Ryu et al. | |
| 6,584,578 B1 | 6/2003 | Faue | |
| 6,788,594 B2 * | 9/2004 | Ware et al. | 365/194 |
| 2002/0001240 A1 | 1/2002 | Ryu et al. | |
| 2003/0002357 A1 | 1/2003 | Kwon et al. | |
| 2003/0081713 A1 | 5/2003 | Pontius et al. | |
| 2003/0095444 A1 | 5/2003 | Ryu et al. | |
| 2003/0117881 A1 | 6/2003 | Johnson et al. | |
| 2003/0154417 A1 | 8/2003 | Drexler | |

FOREIGN PATENT DOCUMENTS

| | | |
|---|---|---|
| JP | 11-353878 | 12/1999 |
| JP | 2001-068650 | 3/2001 |
| JP | 2002-056677 | 2/2002 |
| JP | 2003-045183 | 2/2003 |
| JP | 2003-132680 | 5/2003 |

* cited by examiner

*Primary Examiner*—David Lam
(74) *Attorney, Agent, or Firm*—Blakely Sokoloff Taylor & Zafman

(57) ABSTRACT

An apparatus, for use in a semiconductor device, for providing a domain crossing operation. The apparatus includes a domain crossing sensing block, in response to an operation mode signal, first and second delay locked loop (DLL) clock signals and a CAS latency, generates a plurality of selection signals. An output enable signal generator, in response to the plurality of selection signals, generates a plurality of output enable signals. A data control block, in response to the output enable signals and the CAS latency, controls a data output operation in the semiconductor device. Each of a plurality of data align block, in response to the selection signals, the first and second DLL clock signals and an address signal, aligns data corresponding to the address signal in the data output operation.

34 Claims, 25 Drawing Sheets

SEMICONDUCTOR DEVICE FOR DOMAIN CROSSING

FIELD OF INVENTION

The present invention relates to a semiconductor device; and, more particularly, to a semiconductor device for domain crossing in a synchronous dynamic random access memory SDRAM and double data rate DDR, DDRII, DDRIII SDRAMs.

DESCRIPTION OF PRIOR ART

Generally, in a semiconductor memory device, a domain crossing takes place during its operation. For instance, some devices use an internal clock as an operation reference and the others use a delay locked loop (DLL) clock as the operation reference. In addition, a conversion from a receiver domain to a transmitter domain comes under the domain crossing.

FIG. 1 is a block diagram showing a semiconductor device included in a conventional memory device for domain crossing.

As shown, the conventional memory device includes a first flip-flop 131, a memory cell 140, a second flip-flop 150, a plurality of pipe latches 180, a driver 190, a third flip-flop 132, a domain crossing circuit 161, a controlling and generating block 162, a second read controller 170, an internal clock generator 110 and a DLL block 120.

For the sake of reading and writing data, the conventional memory device may further include more specific function blocks. However, in FIG. 1, there is described only specific function blocks for domain crossing in detail.

An internal clock INT_CLK is generated from an external clock EXT_CLK through the internal block generator 110. The DLL block generates a DLL clock DLL_CLK from the external clock EXT_CLK. Herein, a delay time when the DLL clock passes through a first read controller, a second read controller 170 and the driver 190 is defined as a flight time. In the conventional memory device, a data access is synchronized with the external clock EXT_CLK. As a result, in the DLL block 120, the DLL clock should be generated by compensating the flight time in order to supporting a reliability of the conventional semiconductor memory device.

Herein, compared with the first and third flip-flops 131 and 132 using the internal clock INT_CLK as a reference clock, the controlling and generating block 162, the second read controller 170, the plurality of pipe latches 180 and the driver 190 use the DLL clock as the reference clock. Namely, the domain crossing has occurred. For the domain crossing of the reference clock, there is the domain crossing circuit 161.

FIG. 2 is a block diagram describing the conventional domain crossing circuit 161.

As shown, the conventional domain crossing circuit includes first and second output enable signal generators 210 and 230, a DLL clock delay block 220, a data controller 240, a data output controller 250, first and second data align signal generators 260 and 270.

The first output enable signal generator 210 receives a read command signal CASP_RD and the internal clock INT_CLK and outputs an initial output enable signal OE00. The DLL clock delay block 220 receives a column address strobe (CAS) latency CL and rising and falling DLL clock signals RCLK_DLL and FCLK_DLL generated from the DLL block 120 and generates an output enable clock signal in response to a selected clock signal based on the CAS latency CL. Then, the second output enable signal generator 230 generates a plurality of output enable signals in response to the initial output enable signal OE00 and the output enable clock signal.

The data controller 240 receives the CAS latency CL and the plurality of output enable signals and determines a valid period of output data synchronized with the external clock. The data output controller 250 receives the plurality of output enable signals and determines an active section of a data strobe signal.

After receiving each address signal, e.g., ADD0, the internal clock INT_CLK, the rising and falling DLL clocks RCLK_DLL and FCLK_DLL, the CAS latency CL and the output enable clock signal, each data align signal generator, e.g., 260 outputs a data align signal in response to a logical value of the inputted address signal ADD0 and the CAS latency CL.

FIG. 3 is a block diagram depicting a DLL clock delay block 220 in the conventional domain crossing circuit shown in FIG. 2.

As shown, the DLL clock delay block 220 includes first to third rising clock delay blocks 321A to 321C, first to third falling clock delay block 322A to 322C and first and second MUXs 321D and 322D.

The DLL clock delay block 220 receives the rising and falling DLL clocks RCLK_DLL and FCLK_DLL. The rising DLL clock RCLK_DLL is input to the first to third rising clock delay blocks 321A to 321C. Herein, the first to third rising clock delay blocks 321A to 321C have each different delay value. As a result, first to third delayed rising DLL clocks RCLK_DLL_OE1, RCLK_DLL_OE2 and RCLK_DLL_OE3 each having a different delay value are output from the first to third rising clock delay blocks 321A to 321C. The first MUX 321D outputs at least one among the rising DLL clock RCLK_DLL and the first to third delayed rising DLL clocks RCLK_DLL_OE1, RCLK_DL_OE2 and RCLK_DL_OE3 in response to the CAS latency.

Likewise, the first to third falling clock delay block 322A to 322C receive the falling DLL clocks FCLK_DLL and outputs first to third delayed falling DLL clocks FCLK_DLL_OE1, FCLK_DLL_OE2 and FCLK_DLL_OE3. Then, the second MUX 322D outputs at least one among the falling DLL clock FCLK_DLL and the first to third delayed falling DLL clocks FCLK_DLL_OE1, FCLK_DL_OE2 and FCLK_DL_OE3 in response to the CAS latency.

FIG. 4 is a schematic circuit diagram showing a second output enable signal generator 230 in the conventional domain crossing circuit shown in FIG. 2.

The second output enable signal generator 230 includes a plurality of flip-flops. The plurality of flip-flops is divided into two groups: one 432A to 432F receives output signals of the first MUX 321D; and the other 433A to 433F receives output signals of the second MUX 322D. The initial output enable signal OE00 is inputted to a first flip-flop 431, synchronized with the first delayed rising DLL clocks RCLK_DLL_OE1 and outputted to first flip-flops 432A and 433A of the two groups. The plurality of flip-flops respectively outputs the plurality of output enable signals OE10_DLL, OE15_DLL to OE65_DLL, OE70_DLL in response to the input delayed rising and falling DLL clock. Herein, the plurality of output enable signals OE10_DLL, OE15_DLL to OE65_DLL, OE70_DLL is for determining a valid period of a data (DQ) which is output to an external circuit after it is synchronized with rising and falling edges of the external clock EXT_CLK.

FIG. 5 is a schematic circuit diagram showing the data controller 240 in the conventional domain crossing circuit shown in FIG. 2.

The data controller 240 receives the plurality of output enable signals OE10_DLL, OE15_DLL to OE65_DLL, OE70_DLL and outputs a data pre-enable signal QSEN_PRE and a data enable signal QSEN in response to the CAS latencies CL4 to CL10. As shown, the data controller 240 includes first and second signal selection blocks 541 and 543 and first and second logics 542 and 544. Each signal selection block having a plurality of inverters and a plurality of NAND gates receives a plurality of output enable signals OE15_DLL to OE65_DLL outputted from the other flip-flop group 433A to 433F and selects one in response to the CAS latencies CL4 to CL10. The first and second logics 542 and 544 receives at least one output signals, which are output from the first and second signal selection blocks 541 and 543, and outputs the data pre-enable signal QSEN_PRE and the data enable signal QSEN.

FIGS. 6A and 6B are schematic circuit diagrams showing the data output controller 250 in the conventional domain crossing circuit shown in FIG. 2.

As shown, the data output controller 250 includes a rising output enable signal generator 651, a falling output enable signal generator 652, a signal process block 653 and a third logic 654.

The rising output enable signal generator 651 receives a plurality of output enable signals OE20_DLL to OE60_DLL outputted from the one flip-flop group 433A to 433F in the second output enable signal generator 230 and selects one in response to the CAS latencies CL4 to CL10. The falling output enable signal generator 652 receives a plurality of output enable signals OE15_DLL to OE65_DLL output from the other flip-flop group 433A to 433F in the second output enable signal generator 230 and selects one in response to the CAS latencies CL4 to CL10. The signal process block 653 receives the plurality of output enable signals OE20_DLL to OE60_DLL output from the one flip-flop group 433A to 433F and outputs a result signal of NOR-NAND-NOR calculation to the third logic 654. Then, the third logic 654 outputs a control signal determining an active period of a data strobe signal (DQS) outputted to an external circuit after synchronized with rising and falling edges of the external clock EXT_CLK.

FIG. 7 is a schematic circuit diagram showing the first data align signal generator 260 in the conventional domain crossing circuit shown in FIG. 2.

The first data align signal generator 260 has a plurality of flip-flops 762 to 766. Each flip-flop receives each delayed rising DLL clock, e.g., RCLK_DLLOE1, RCLK_DLL_OE2 and RCLK_DLL_OE3 and the rising DLL clock RCLK_DLL at a clock terminal and outputs each data align signal, e.g., SOSEZ15, SOSEZ25, SOSEZ35, SOSEZ45 and SOSEZ55. Likewise, if not shown, the second data align signal generator 270 has a plurality flip-flops which respectively receive each delayed falling DLL clock, e.g., FCLK_DLL_OE1, FCLK_DLL_OE2 and FCLK_DLL_OE3 and the falling DLL clock FCLK_DLL at a clock terminal and outputs each data align signal.

FIGS. 8A to 8C are timing diagrams demonstrating an operation of the conventional domain crossing circuit shown in FIG. 2. In detail, FIG. 8B describes the operation of the conventional single clock domain crossing circuit when the CAS latency is 3; and FIG. 8C depicts the operation of the convention multi clocks domain crossing circuit when the CAS latency is 5.

As shown in FIG. 8A, it is assumed that the CAS latency is 6. After a read instruction RD is input, a data output enable signal ROUTEN should be activated in response to the CAS latency. Namely, the data output enable signal ROUTEN is activated before the sixth timing '6' of the external clock CLK if the read instruction RD is inputted at the initial timing '0'.

In the conventional domain crossing circuit, the DLL clock DLL_CLK passes through a plurality of flip-flops. In response to the CAS latency CL, the initial output enable signal OE00 is also delayed by a plurality of flip-flops. However, if an operation of the semiconductor system is faster, the plurality of flip-flops delaying DLL clock is unstable because a setup time of each flip-flop is not guaranteed. Thus, a total delay time ΔT of the output enable signal is not fixed in response to the CAS latency CL. Then, it is not guaranteed that the data output enable signal ROUTEN is activated in response to the CAS latency CL.

In addition, an abnormal operation of the semiconductor system can result from a low power voltage, a temperature, a complex process and the like. If the setup time of each flip-flop included in a high frequency semiconductor system is not guaranteed sufficiently, the high frequency semiconductor system may not operate properly.

SUMMARY OF INVENTION

It is, therefore, an object of the present invention to provide a semiconductor system having a domain crossing circuit which detects a phase difference between an internal clock and a delay locked loop (DLL) clock, senses a flight time when the DLL clock passes from a DLL clock generator to a data output driver and protects against an abnormal operation of the semiconductor system resulting from a high frequency, a low power voltage, a temperature, a complex process and the like by considering the phase difference and the flight time into the domain crossing circuit.

In accordance with an aspect of the present invention, it is provided with an apparatus, for use in a semiconductor device, for providing a domain crossing operation including a domain crossing sensing block in response to an operation mode signal, first and second delay locked loop (DLL) clock signals and a CAS latency for generating a plurality of selection signals; an output enable signal generator in response to the plurality of selection signals for generating a plurality of output enable signals; a data control block in response to the output enable signals and the CAS latency for controlling a data output operation in the semiconductor device; and a plurality of data align block, each in response to the selection signals, the first and second DLL clock signals and an address signal for aligning data corresponding to the address signal in the data output operation.

In accordance with another aspect of the present invention, it is provided with a semiconductor device for providing a domain crossing operation including a domain crossing sensing block in response to an operation mode signal, first and second delay locked loop (DLL) clock signals and a CAS latency for generating a plurality of selection signals; an output enable signal generator in response to the plurality of selection signals for generating a plurality of output enable signals; a data control block in response to the output enable signals and the CAS latency for controlling a data output operation in the semiconductor device; and a plurality of data align block, each in response to the selection signals, the first and second DLL clock signals and an address signal for aligning data corresponding to the address signal in the data output operation.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor device for domain crossing according to the present invention will be described in detail referring to the accompanying drawings.

Figure 1:
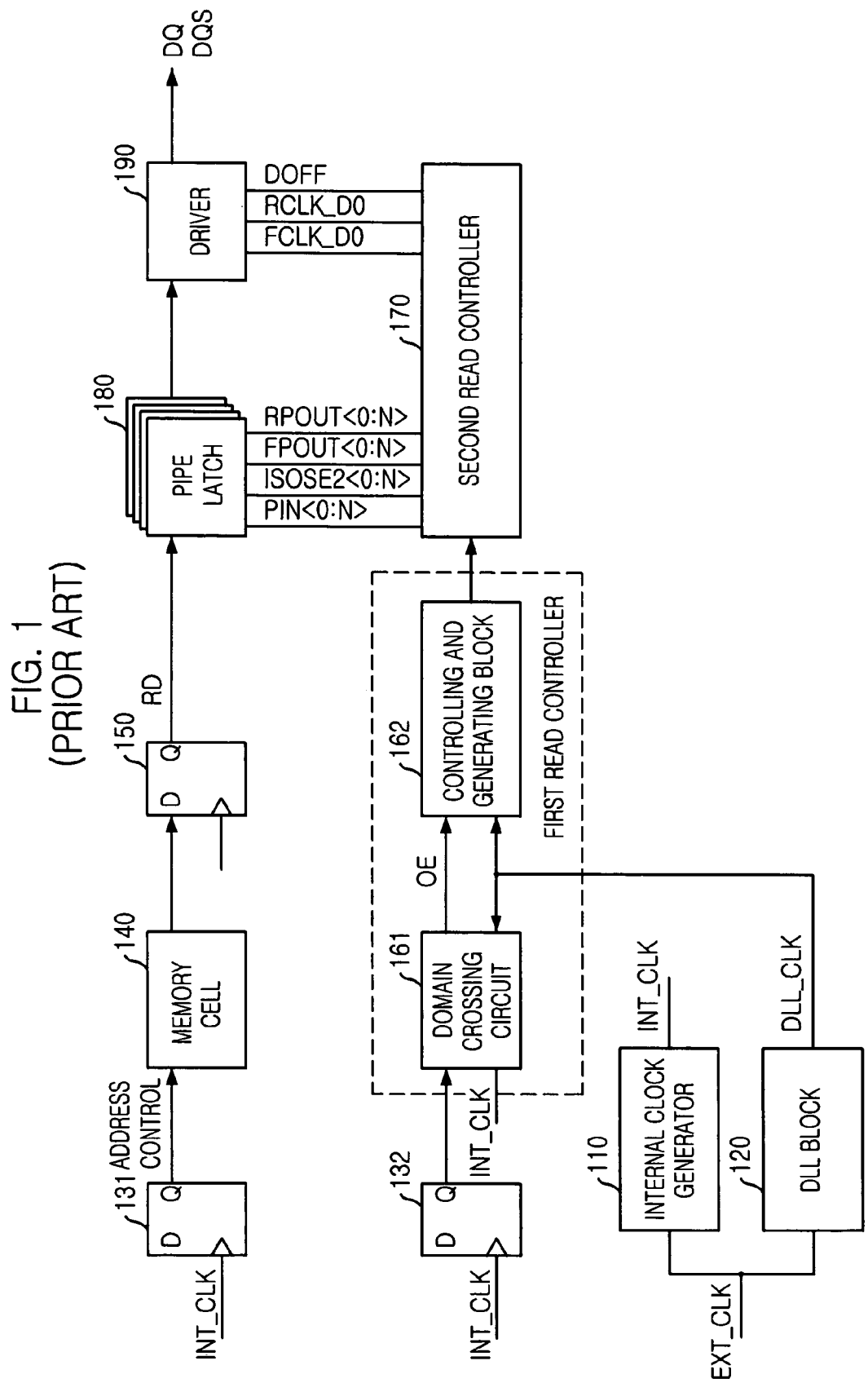
FIG. 1 is a block diagram showing a semiconductor device included in a conventional memory device for domain crossing.
Figure 2:
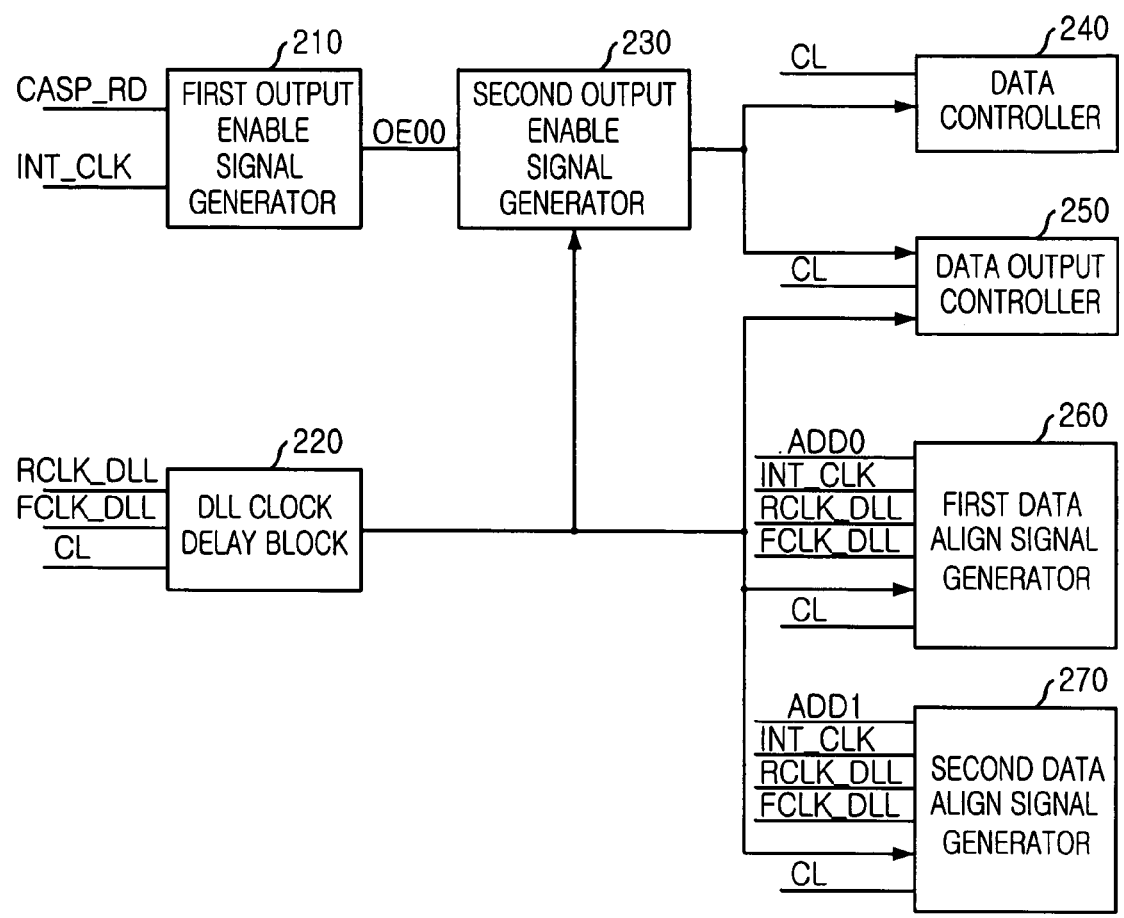
FIG. 2 is a block diagram describing a conventional domain crossing circuit.
Figure 3:
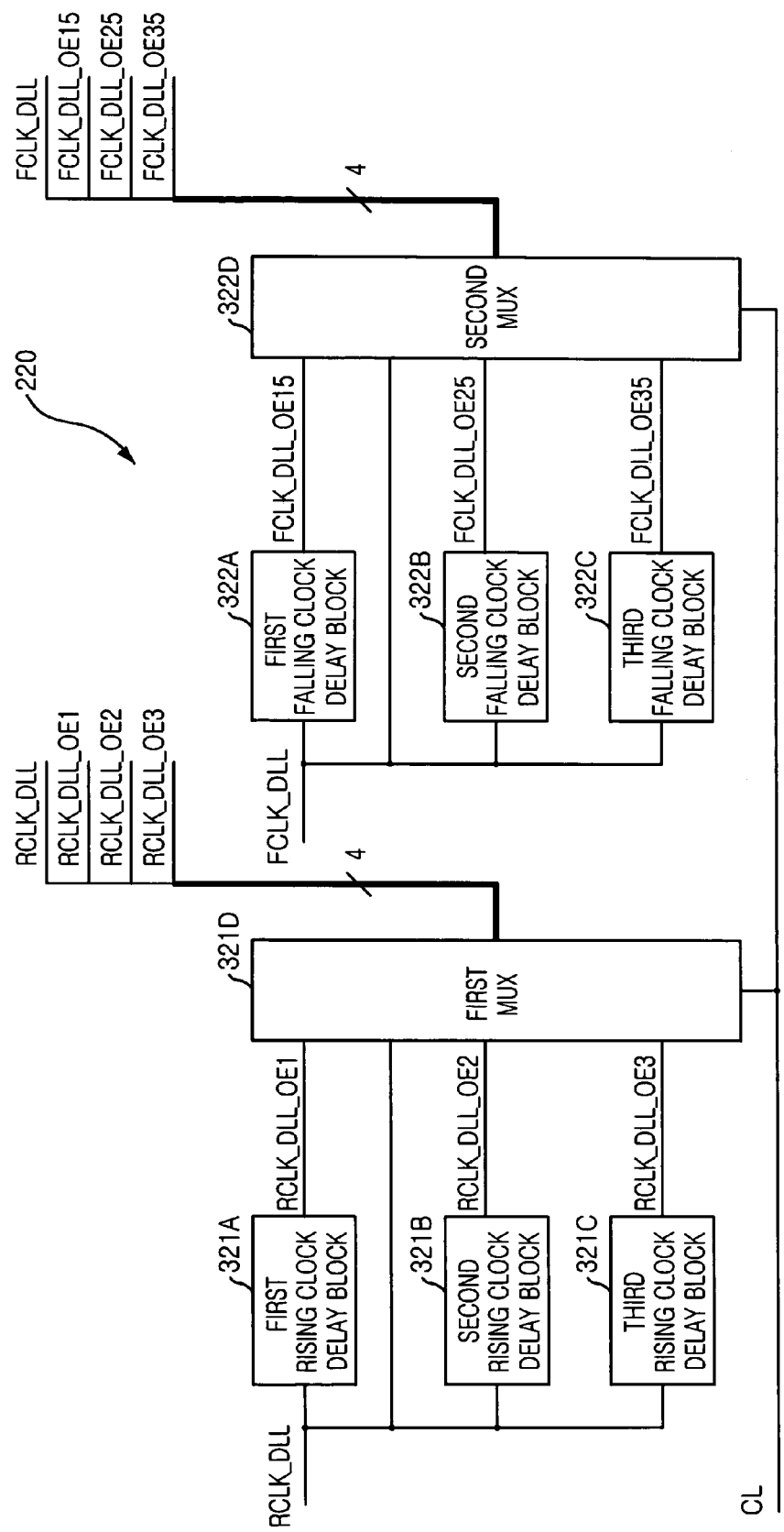
FIG. 3 is a block diagram depicting a DLL clock delay block in the conventional domain crossing circuit shown in FIG. 2.
Figure 4:
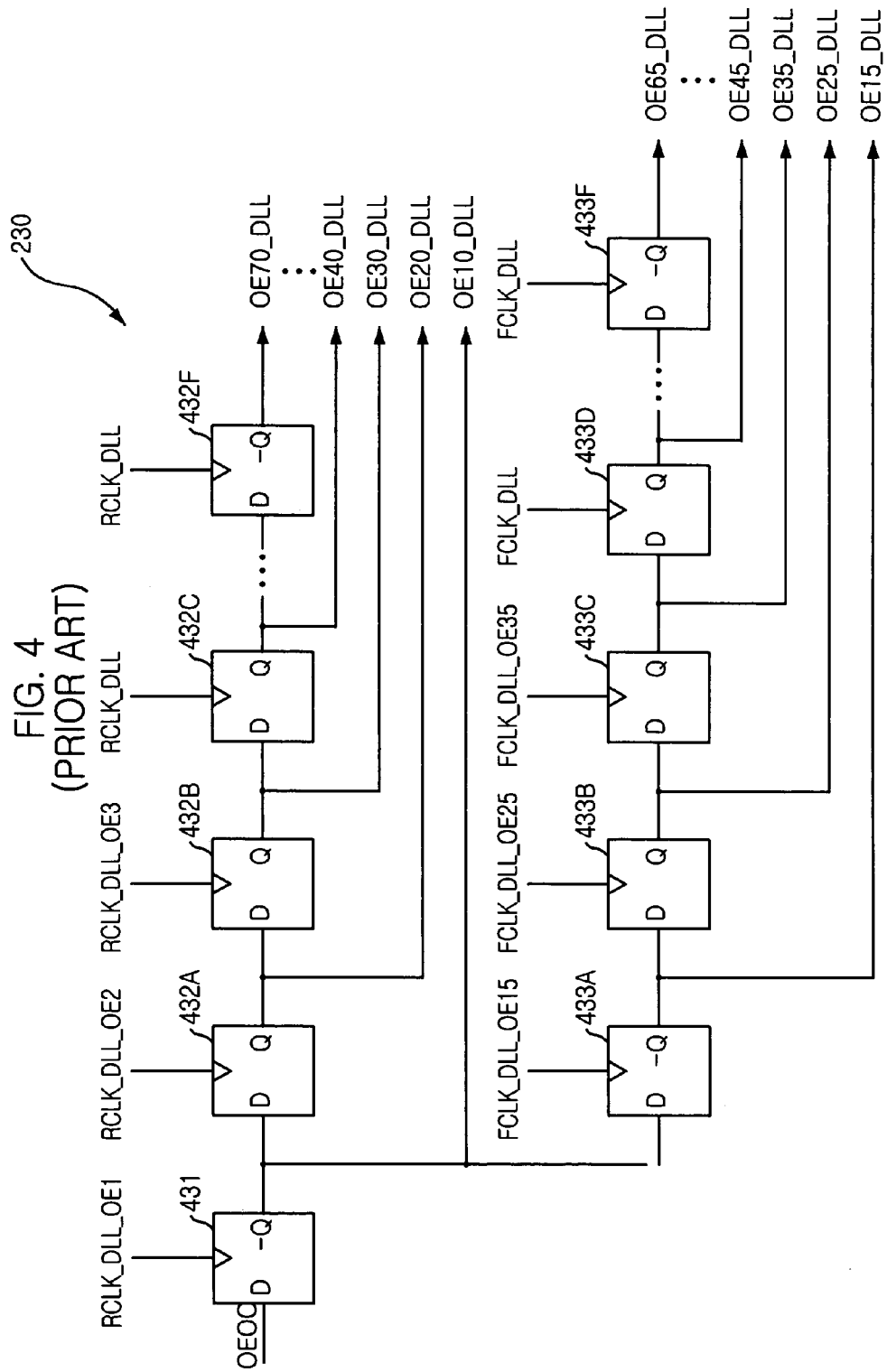
FIG. 4 is a schematic circuit diagram showing a second output enable signal generator in the conventional domain crossing circuit shown in FIG. 2.
Figure 5:
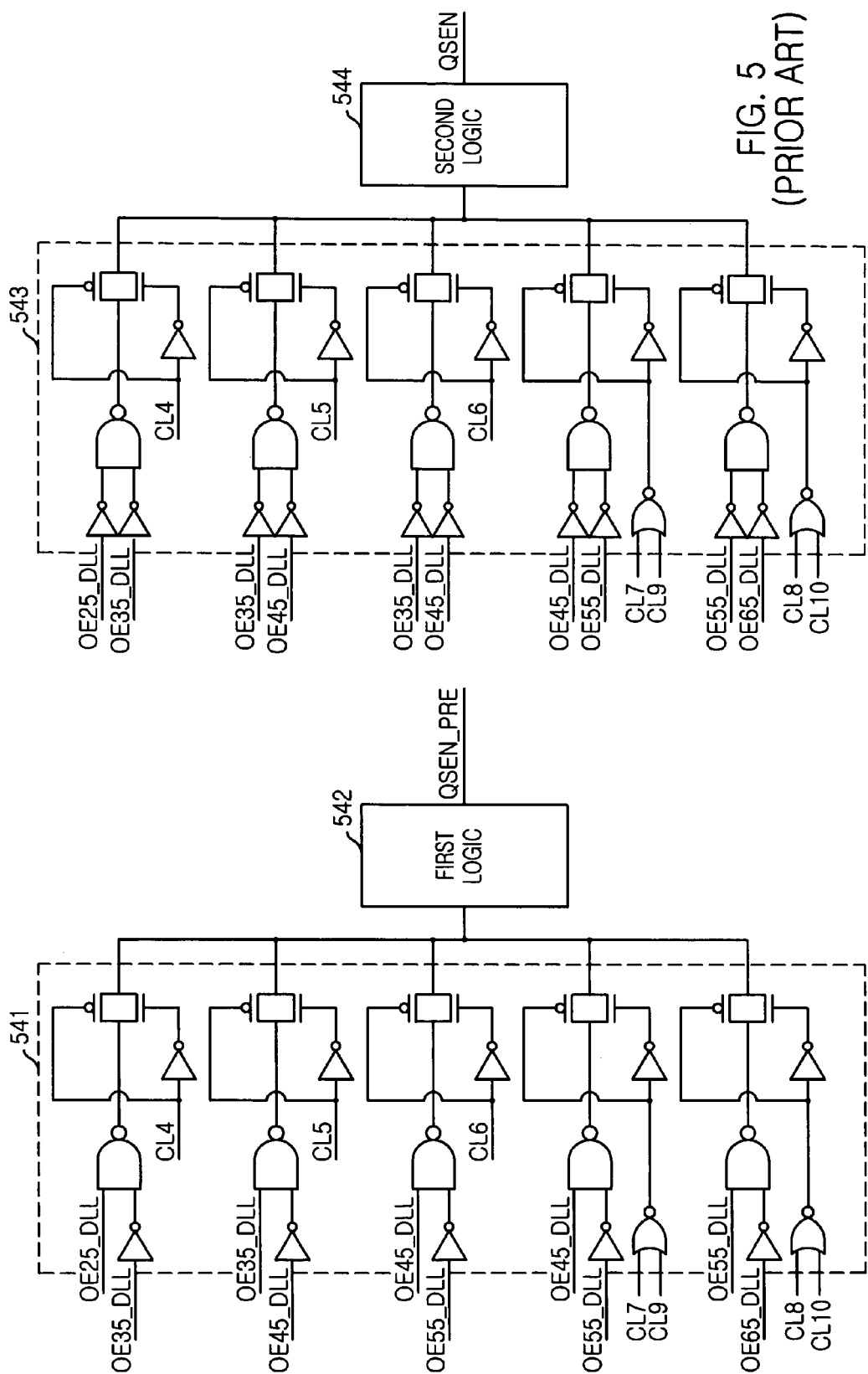
FIG. 5 is a schematic circuit diagram showing a data controller in the conventional domain crossing circuit shown in FIG. 2.
Figure 6A:
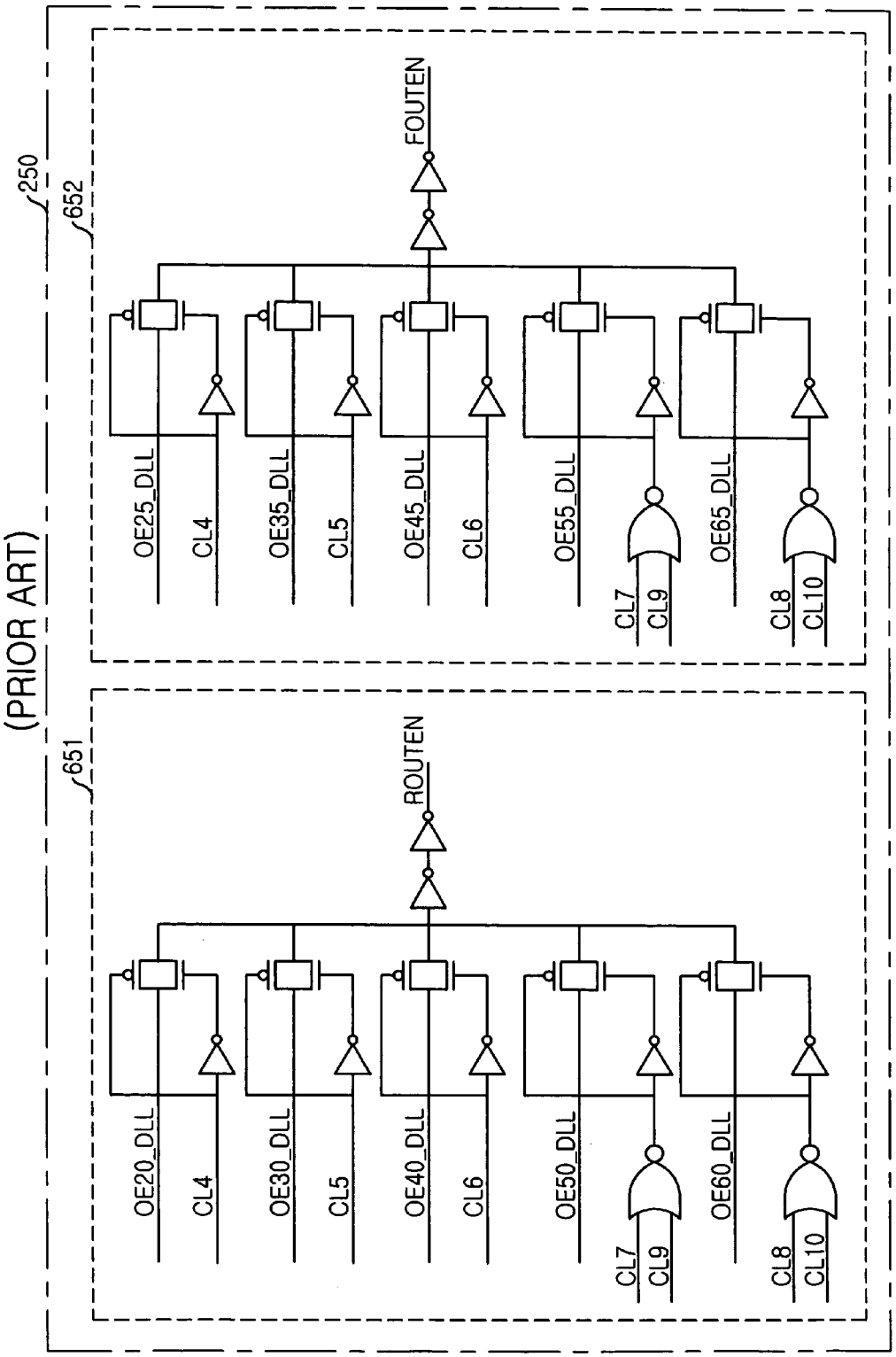
FIGS. 6A and 6B are schematic circuit diagrams showing a data output controller in the conventional domain crossing circuit shown in FIG. 2.
Figure 6B:
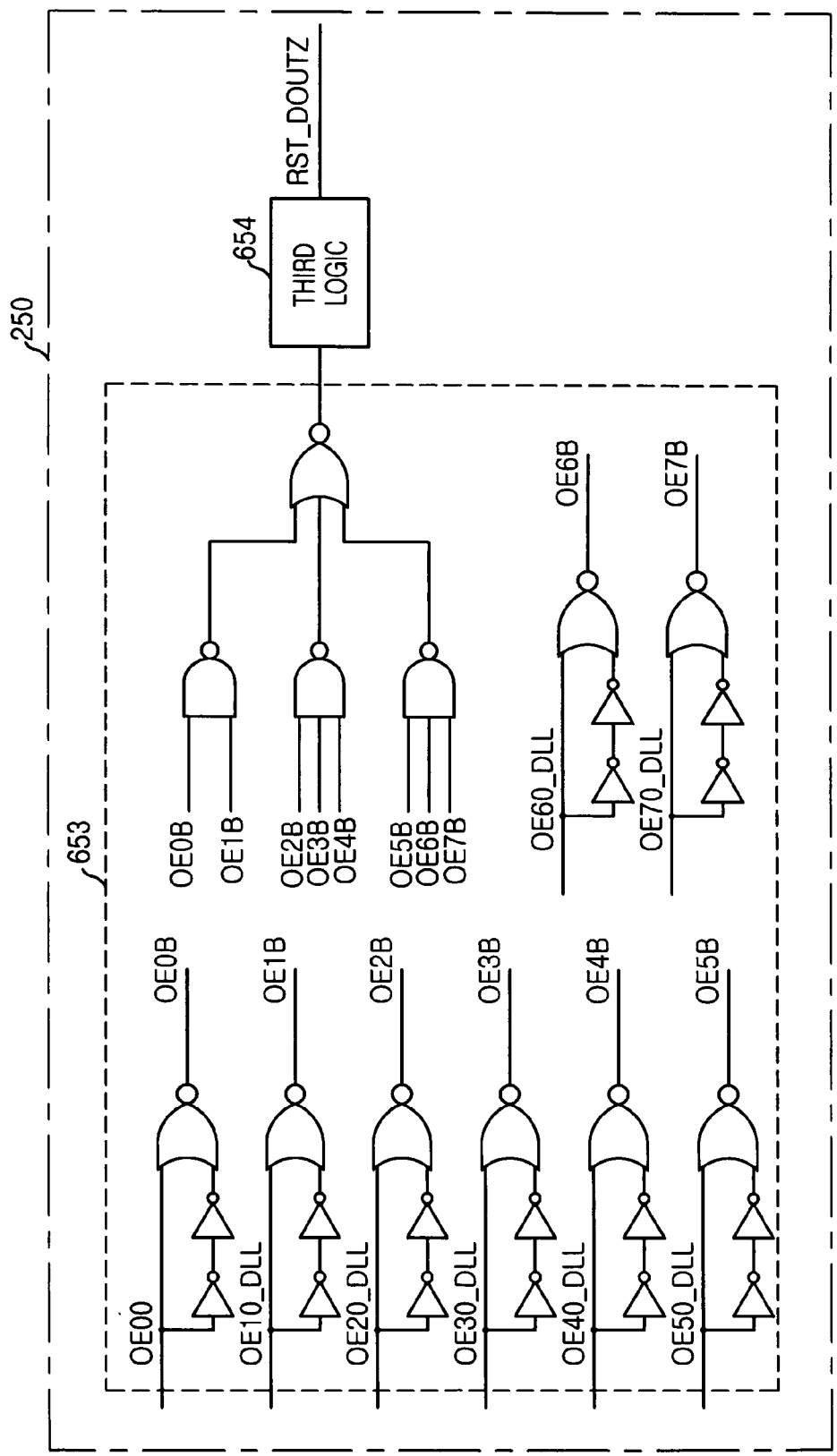
Figure 7:
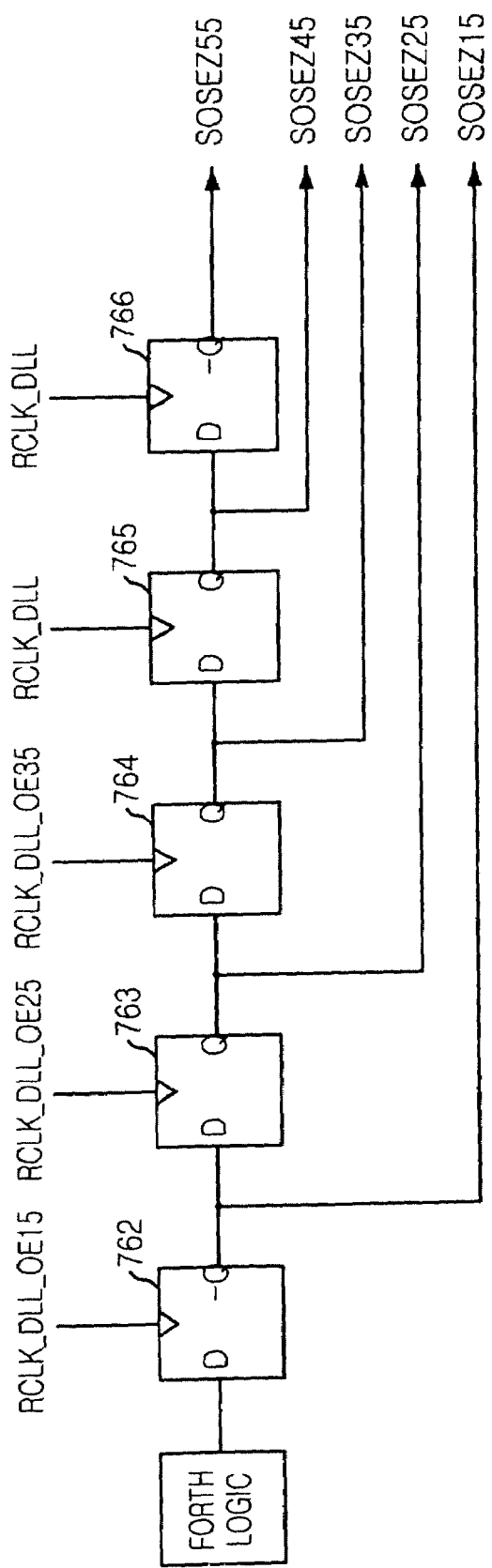
FIG. 7 is a schematic circuit diagram showing a first data align signal generator in the conventional domain crossing circuit shown in FIG. 2.
Figure 8A:
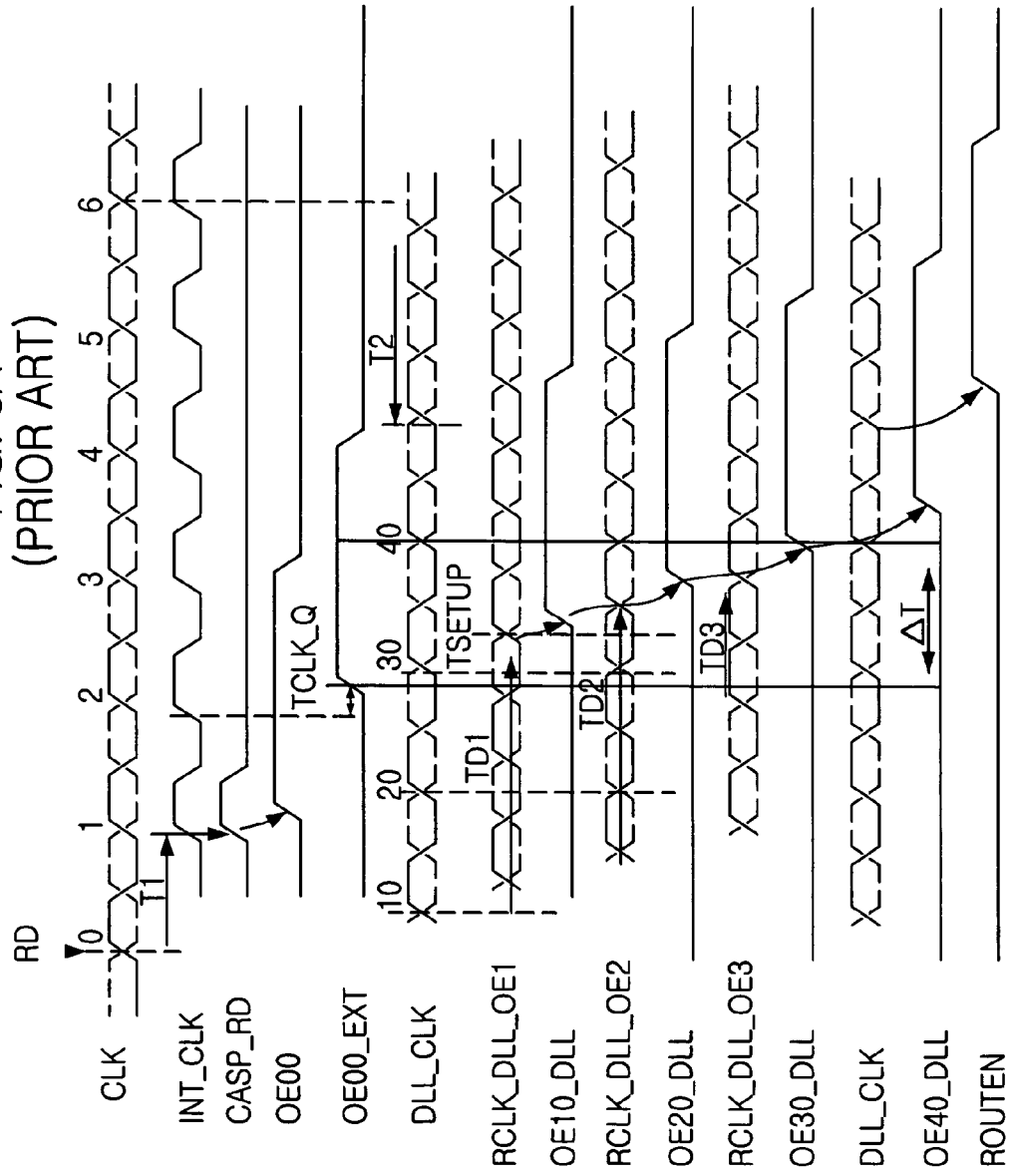
FIGS. 8A to 8C are timing diagrams demonstrating an operation of the conventional domain crossing circuit shown in FIG. 2.
Figure 8B:
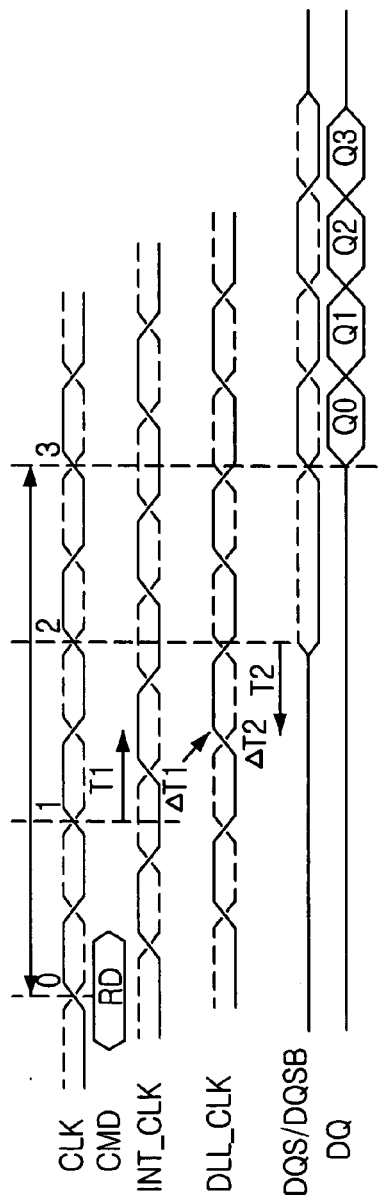
Figure 8C:
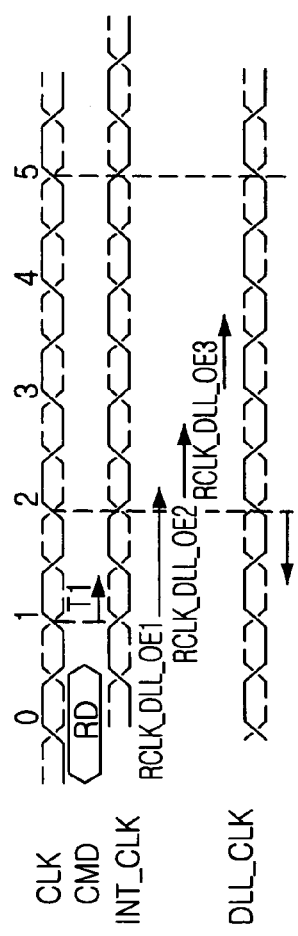
Figure 9:
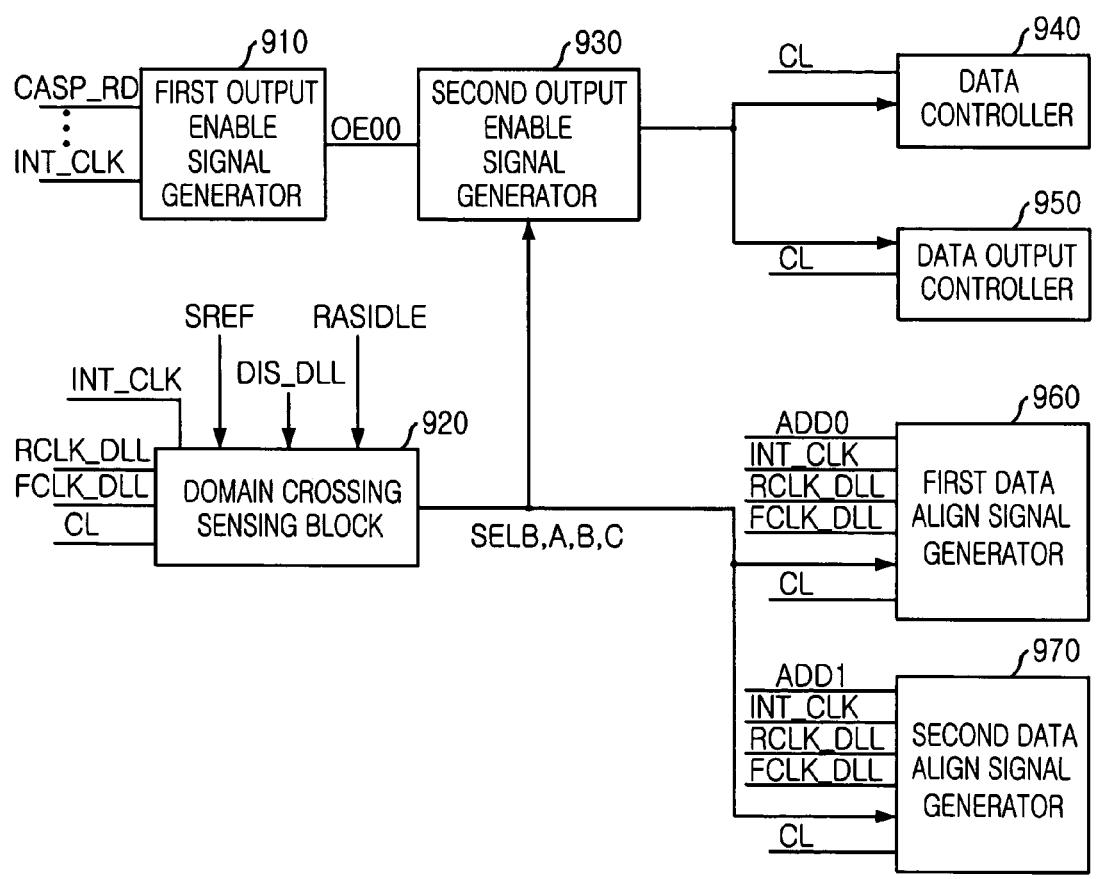
FIG. 9 is a block diagram describing a domain crossing circuit in accordance with the present invention.

FIG. 9 is a block diagram describing a domain crossing circuit in accordance with the present invention.

The domain crossing circuit includes a domain crossing sensing block 920, a first output enable signal generator 910, a second output enable signal generator 930, a data controller 940, a data output controller 950, a first data align signal generator 960 and a second data align signal generator 970.

The domain crossing sensing block 920 enabled by an internal clock INT_CLK receives a refresh state signal SREF, a DLL disable signal DIS_DLL and a RAS idle signal RASIDLE. Then, the domain crossing sensing block 920 detects a phase of rising and falling DLL clock signals RCLK_DLL and FCLK_DLL in response to a CAS latency CL and generates a setup selection signal SELB and a plurality of output selection signals A, B and C in response to the detection result.

The first output enable signal generator 910 generates an output initialization signal OE00 synchronized with the internal clock INT_CLK by a read instruction. The second output enable signal generator 930 receives the plurality of output selection signals A, B and C and the output initialization signal OE00 and generates a plurality of delayed output enable signals.

The data controller 940 receives the plurality of delayed output enable signals and generates a data enable signal deciding a valid period of an outputted data. The data output controller 950 receives the plurality of delayed output enable signals and generates a data strobe enable signal which defines an active period of a data strobe signal.

The first data align signal generator 960 receives a first address ADD0 and generates a first data align signal which aligns the input data in response to the first address ADD0 and the detection result of the domain crossing sensing block. And, the second data align signal generator 970 receives a second address ADD1 and generates a first data align signal which aligns the input data in response to the second address ADD1 and the detection result of the domain crossing sensing block.

Figure 10:
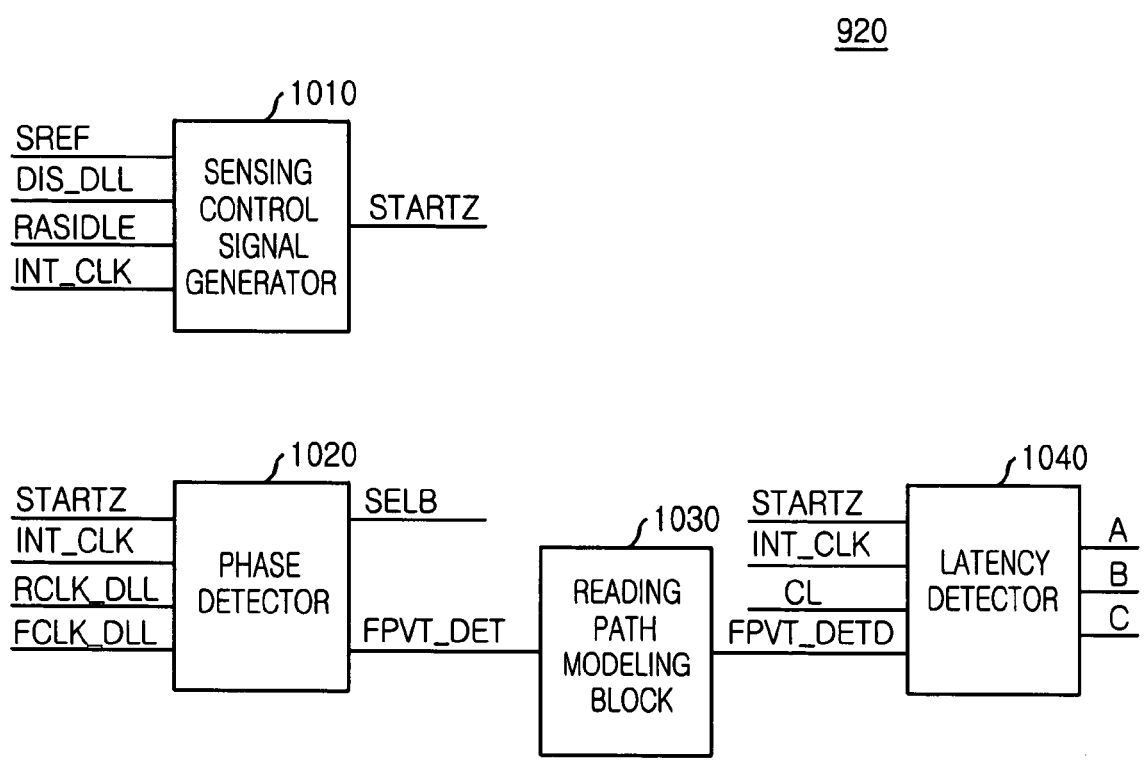
FIG. 10 is a block diagram depicting a domain crossing sensing block in the domain crossing circuit in accordance with the present invention.

FIG. 10 is a block diagram depicting the domain crossing sensing block 920 in the domain crossing circuit in accordance with the present invention.

The domain crossing sensing block 920 includes a sensing control signal generator 1010, a phase detector 1020, a reading path modeling block 1030 and a latency detector 1040.

The sensing control signal generator 1010 generates a sensing start signal STARTZ in response to the refresh state signal SREF, the DLL disable signal DIS_DLL and the RAS idle signal RASIDLE. The phase detector 1020 compares the rising DLL clock signal RCLK_DLL with the falling DLL clock signal FCLK_DLL in response to the sensing start signal STARTZ and generates the setup selection signal SELB, which is activated during the CAS latency CL, and a phase detection signal FPVT_DETD, which defines a phase detection period, in response to the setup selection signal SELB;

The reading path modeling block 1030 delays the phase detection signal FPVT_DET by a predetermined value, which is equal to a delay time through a data reading path, and generates a delayed phase detection signal FPVT_DETD. The latency detector 1040 compares the delayed phase detection signal with the CAS latency synchronized with the internal clock and generates the plurality of output selection signals A, B and C.

Figure 11:
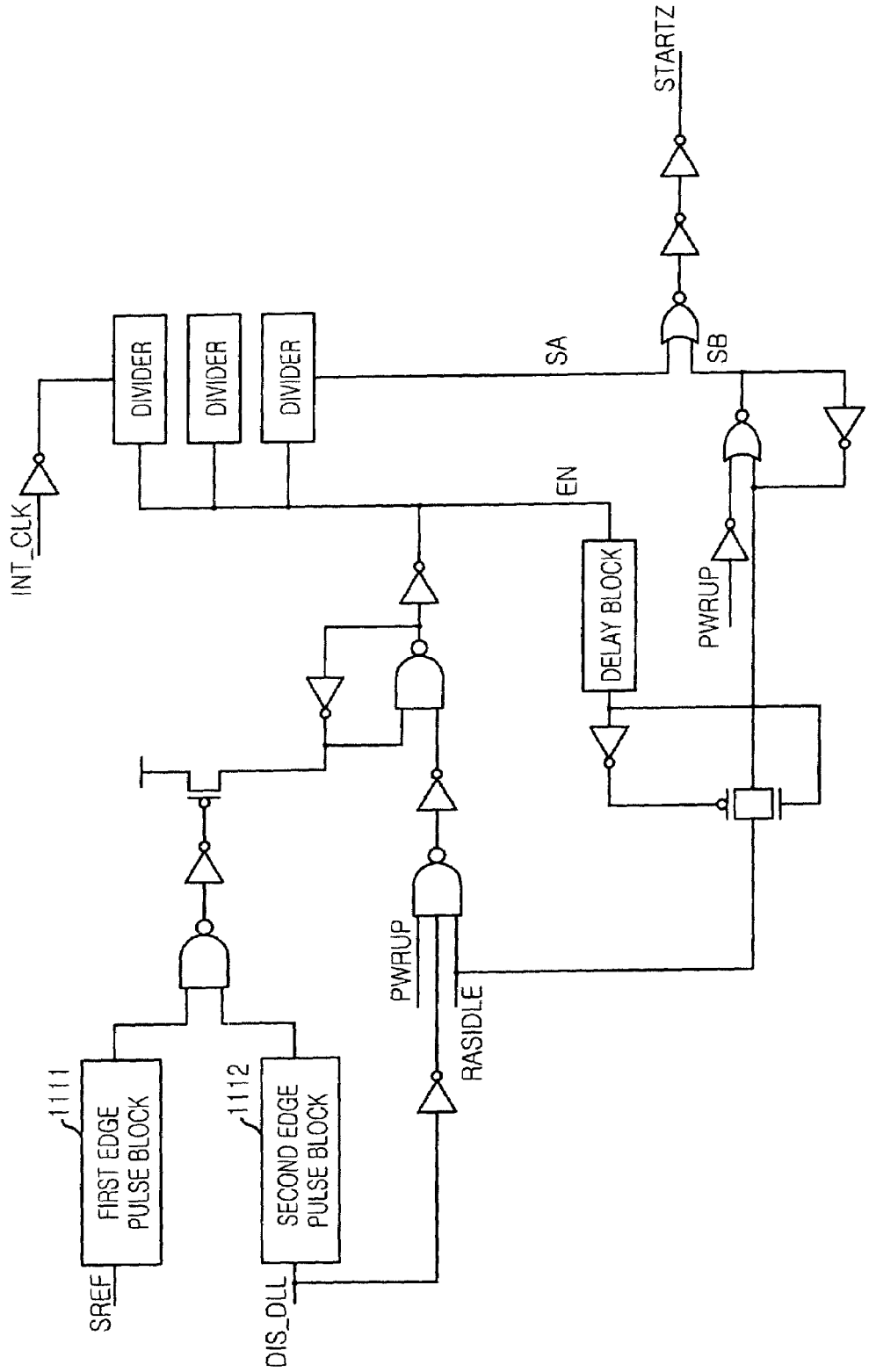
FIG. 11 is a block diagram showing a sensing control signal generator in the domain crossing circuit in accordance with the present invention.

FIG. 11 is a block diagram showing the sensing control signal generator 1010 in the domain crossing circuit in accordance with the present invention.

As shown, the sensing control signal generator 1010 receives the refresh state signal SREF, the DLL disable signal DIS_DLL and the RAS idle signal RASIDLE. First, first and second edge pulse blocks 1111 and 1112 respectively output first and second edge pulses in response to the refresh state signal SREF and the DLL disable signal DIS_DLL. Then, the sensing start signal STARTZ is generated in response to the RAS idle signal RASIDLE, the internal clock INT_CLK and the first and second edge pulses.

Figure 12:
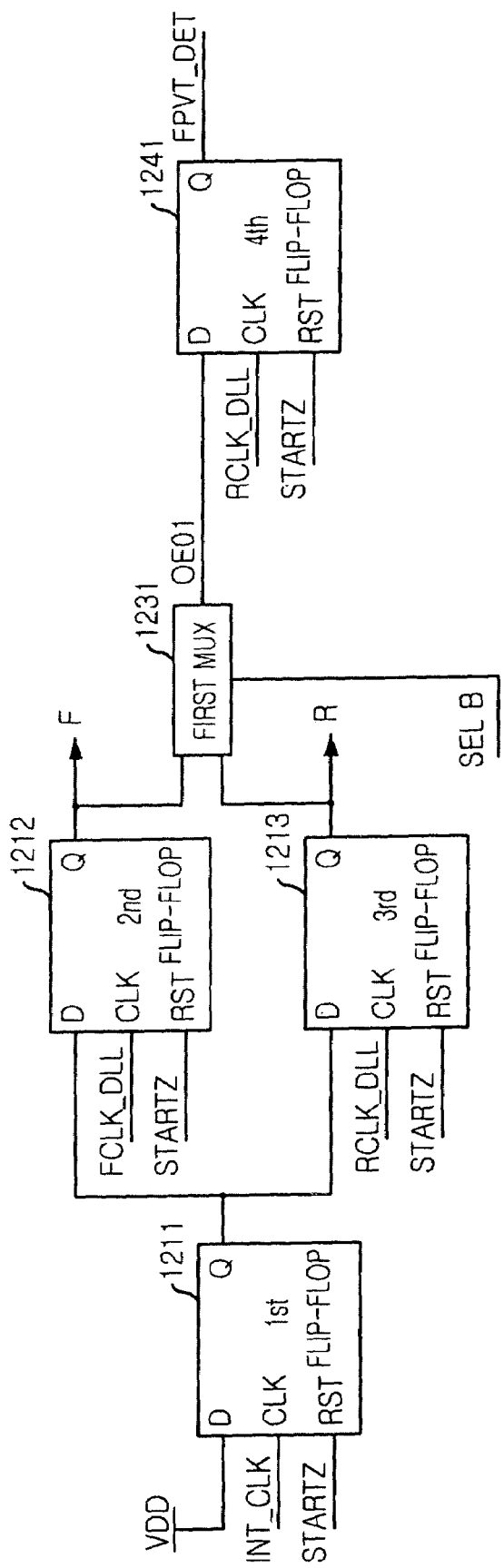
FIG. 12 is a block diagram describing a phase detector in the domain crossing circuit in accordance with the present invention.
Figure 12:
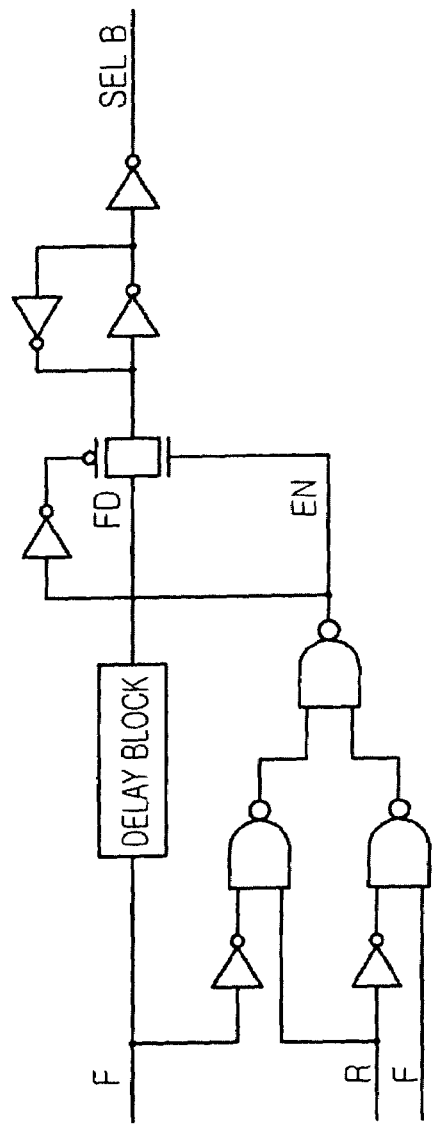

FIG. 12 is a block diagram describing the phase detector 1020 in the domain crossing circuit in accordance with the present invention.

The phase detector 1020 includes an internal to DLL phase detection block, a latency detection start block and a phase detection selection block.

The internal to DLL phase detection block has first to third flip-flops 1211 to 1213 and a first MUX 1231. The first flip-flop 1211 synchronizes the supply voltage VDD with the internal clock INT_CLK, and the second and third flip-flops 1212 and 1213 respectively synchronizes an outputted signal of the first flip-flop with the rising and falling DLL clock FCLK_DLL and RCLK_DLL.

Then, the phase detection selection block receives output signals F and R of the second and third flip-flops 1212 and 1213 and generates the setup selection signal SELB.

Thereafter, the first MUX 1231 included in the internal to DLL phase detection block selects one of the outputted signals F and R of the second and third flip-flops 1212 and 1213 in response to the setup selection signal SELB.

Next, in latency detection start block 1241, the selected signal OE01 outputted from the first MUX 1231 is synchronized with the rising DLL clock RCLK_DLL. The latency detection start block 1241 outputs the phase detection signal FPVT_DET.

Figure 13:
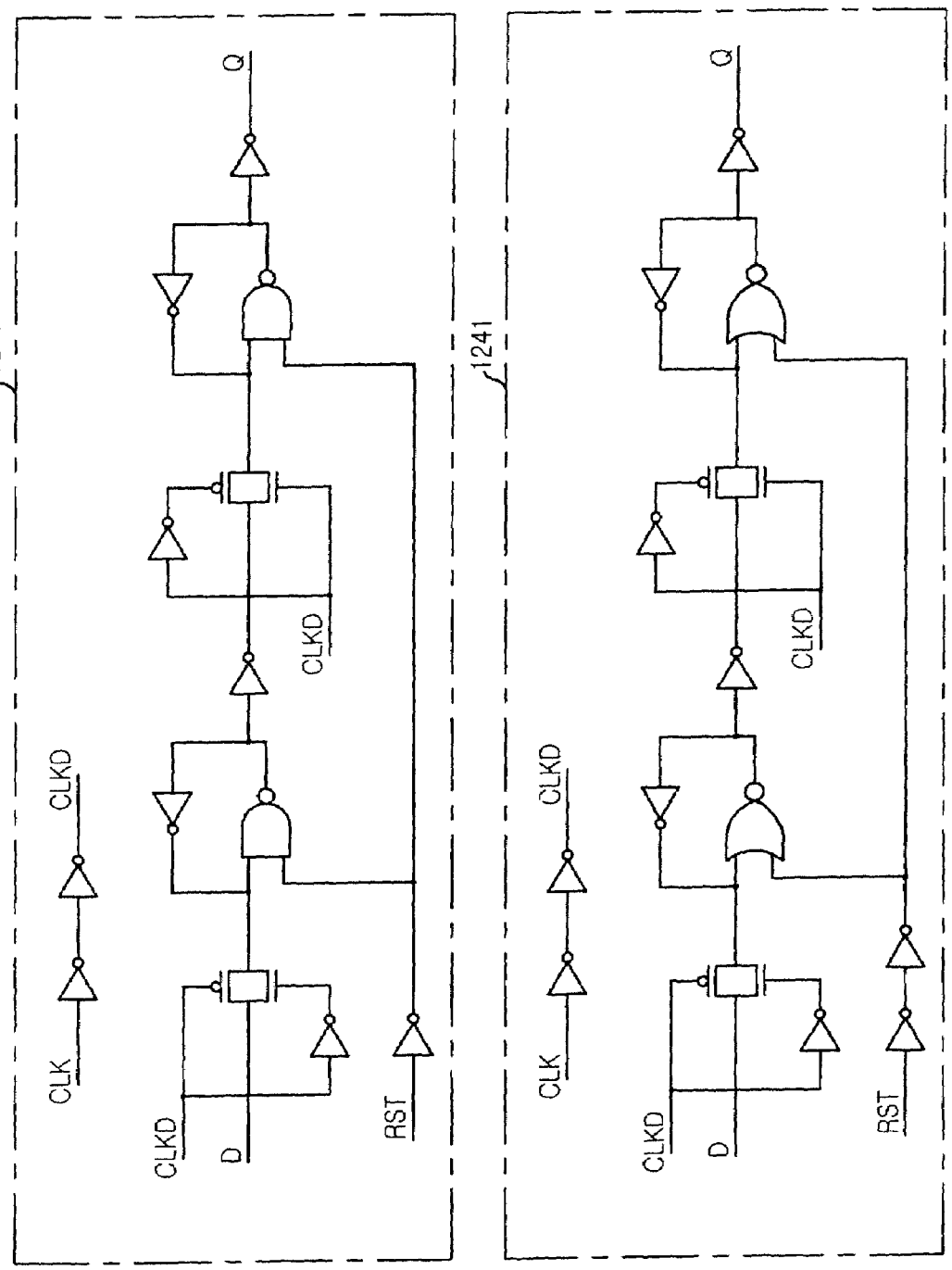
FIG. 13 is a block diagram depicting an internal part of the phase detector shown in FIG. 12.

FIG. 13 is an internal schematic circuit diagram depicting the flip-flop, e.g., 1211 and 1241 included in the phase detector shown in FIG. 12.

As shown, each flip-flop synchronizes a data signal inputted at D terminal with a clock signal input at CLK terminal and outputs the synchronized data signal to Q terminal.

Figure 14A:
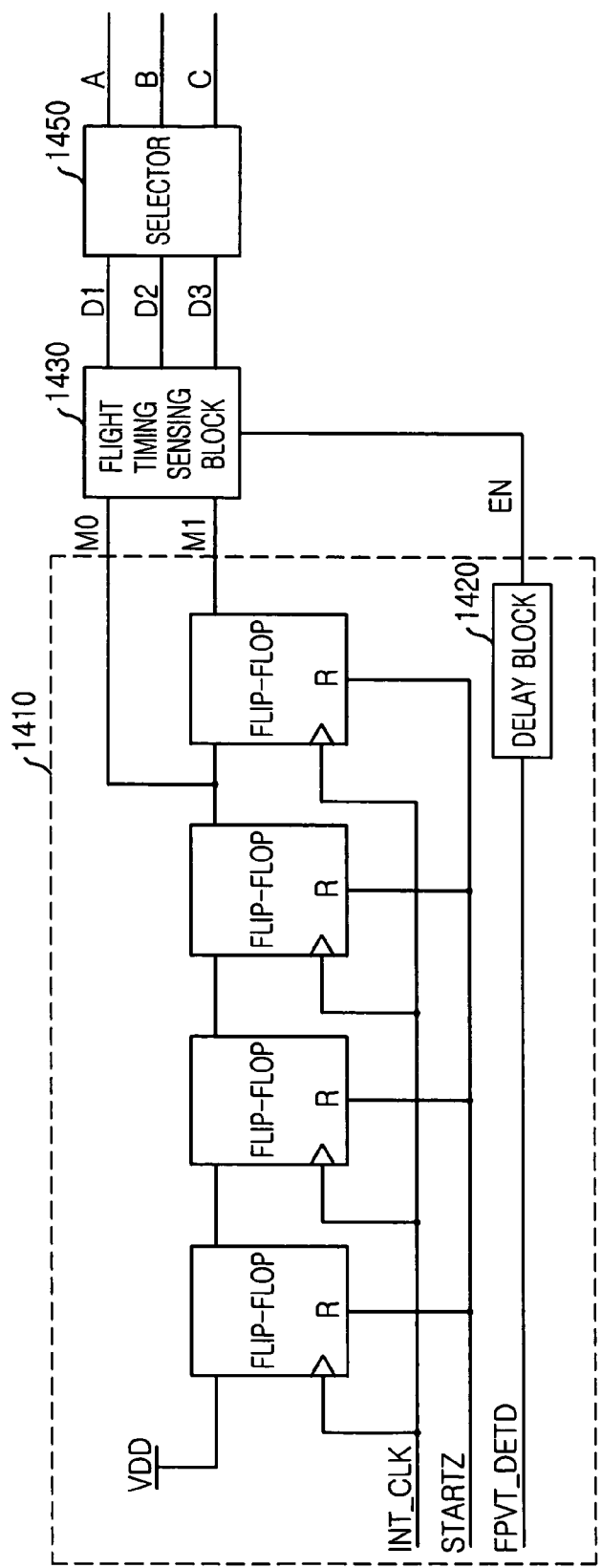
FIGS. 14A to 14C are block diagrams showing a latency detector in the domain crossing sensing block shown in FIG. 10.
Figure 14B:
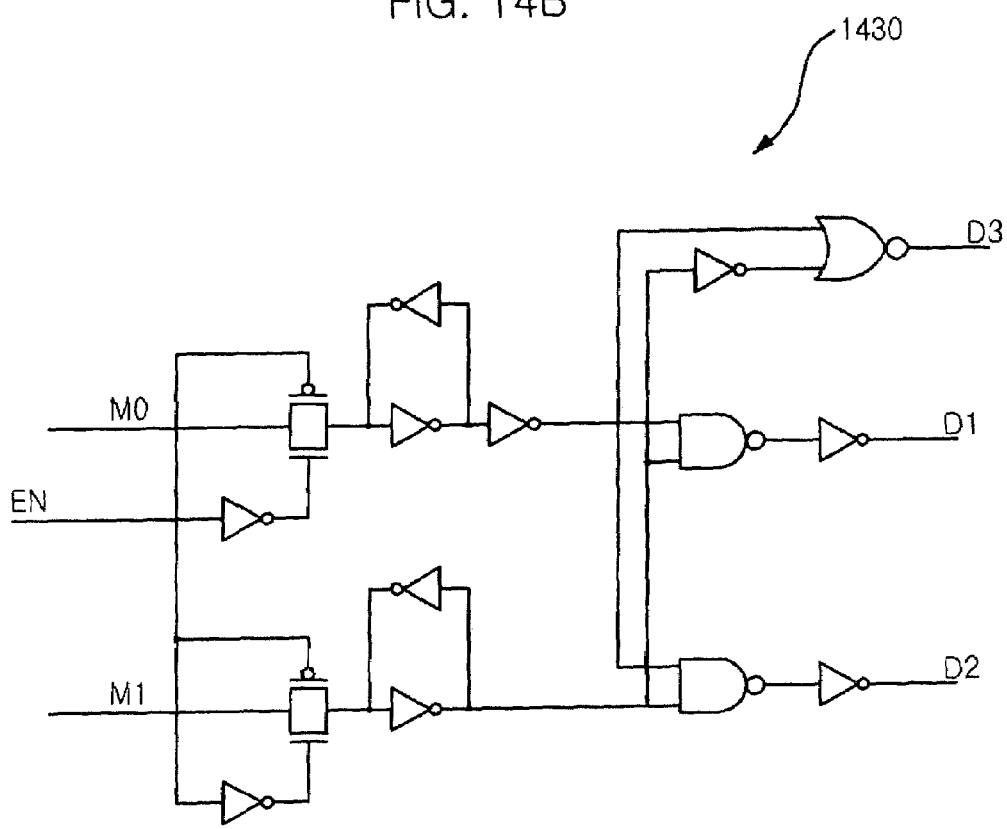
Figure 14C:
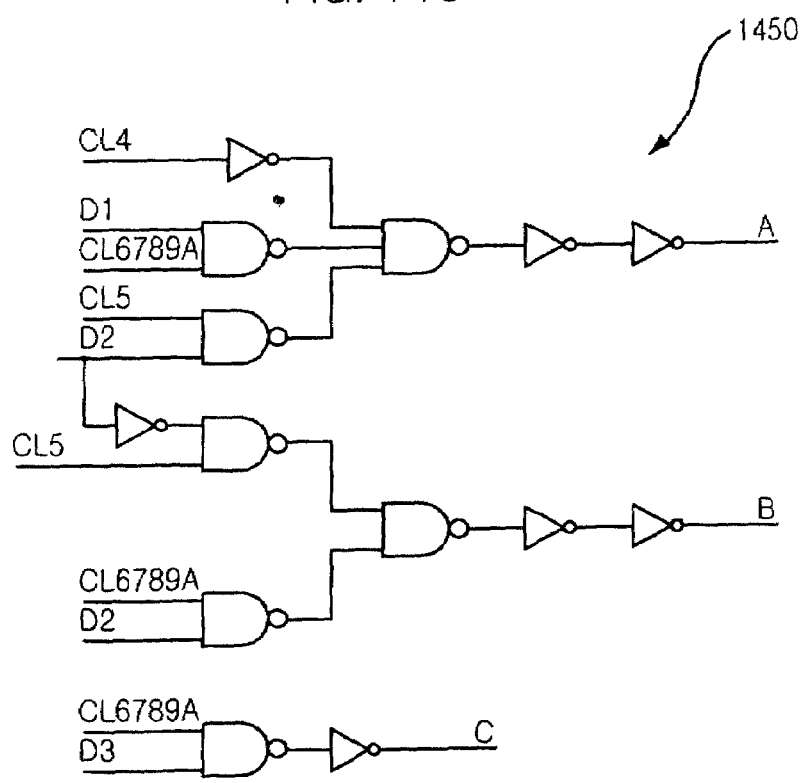

FIGS. 14A to 14C are block diagrams showing the latency detector 1040 in the domain crossing sensing block shown in FIG. 10.

As shown, the latency detector 1040 includes a first flip-flop group 1410, a flight timing sensing block 1430 and a selector 1450.

The first flip-flop group 1410, which has a plurality of flip-flops, synchronizes the supply voltage VDD with the internal clock INT_CLK. In detail, each flip-flop included in the first flip-flop group 1410 receives the internal clock at a clock terminal, the sensing start signal at a reset terminal and a supply voltage at an input terminal. Then, input and output signals M0 and M1 of the last flip-flop in the first flip-flop group 1410 are output to the flight timing sensing block 1430.

The delayed phase detection signal FPVT_DETD output from the reading path modeling block 1030 is delayed. As a result, a first control signal EN delayed by a delay block 1420 is output to the flight timing sensing block 1430.

Referring to FIG. 14B, the flight timing sensing block 1430 receives the input and output signals M0 and M1 and the first control signal EN and generates a plurality of plurality of flight detection signals D1 to D3 in response to the input and output signals M0 and M1.

Referring to FIG. 14C, the selector 1450 outputs the plurality of output selection signals A, B and C in response to the plurality of flight detection signals D1 to D3. Herein, "CL6789A" means one among CL6, CL7, CL8, CL9 and CL 10.

Figure 15:
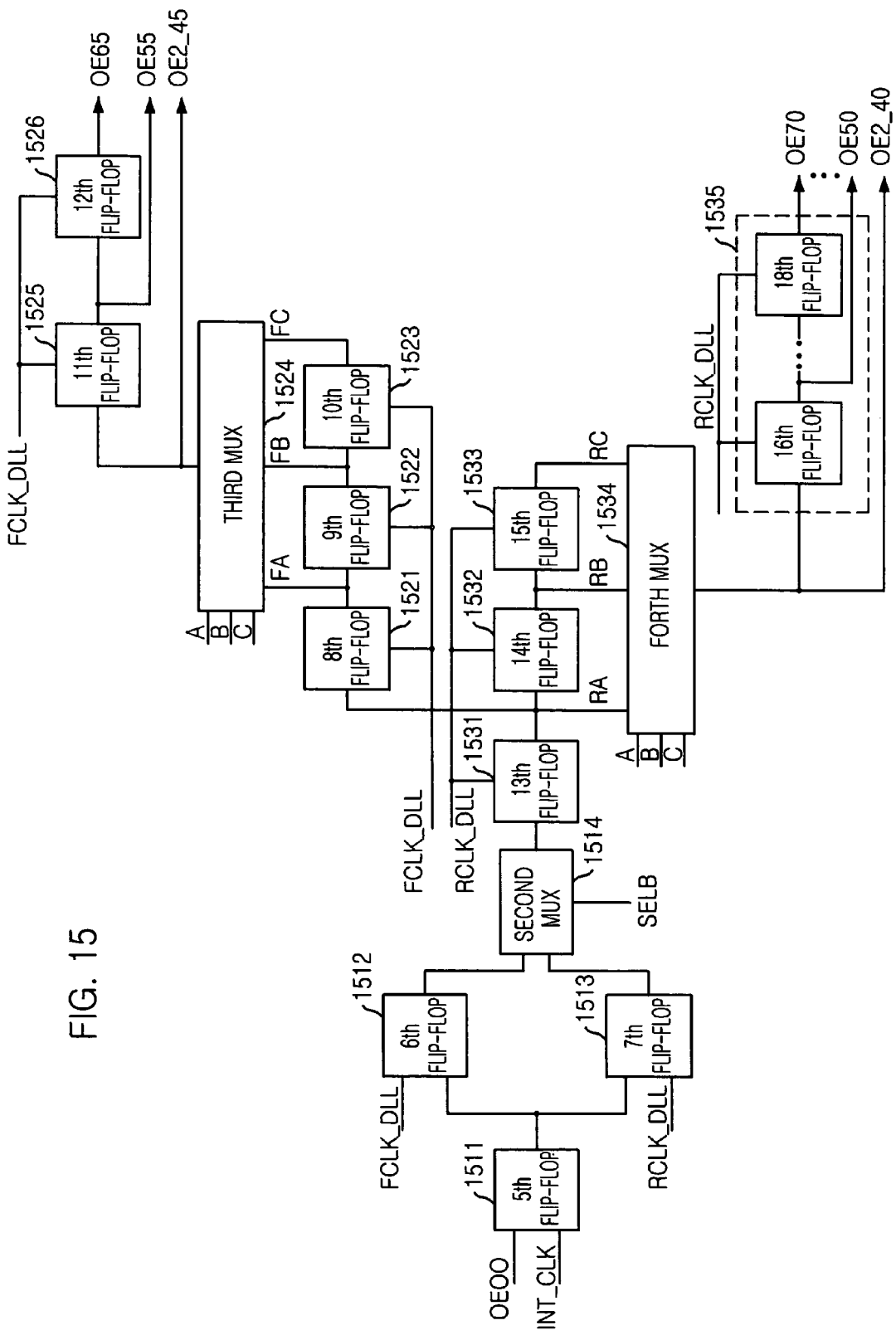
FIG. 15 is a block diagram describing a second output enable signal generator in the domain crossing circuit shown in FIG. 9.

FIG. 15 is a block diagram describing the second output enable signal generator 930 in the domain crossing circuit shown in FIG. 9.

As described above, the second output enable signal generator 930 receives the plurality of output selection signals A, B and C and the output initialization signal OE00 and generates the plurality of delayed output enable signals, e.g., OE2_40.

As shown, the second output enable signal generator 930 includes second to forth MUX 1514, 1524 and 1534 and a plurality of flip-flops 1511, 1512, . . . , 1535.

The second MUX 1514 selects a based control signal for generating the plurality of delayed output enable signals in response to the setup selection signal SELB. Namely, the setup selection signal SELB determines whether the plurality of delayed output enable signals is generated based on the rising DLL clock RCLK_DLL or the falling DLL clock FCLK_DLL.

The $13^{th}$ flip-flop 1531 synchronizes the based control signal with the rising DLL clock RCLK_DLL. After receiving an output signal from the $13^{th}$ flip-flop 1531, the $14^{th}$ and $15^{th}$ flip-flops 1532 and 1533 respectively outputs control signals RB and RC synchronized with the rising DLL clock RCLK_DLL. Then fourth MUX 1534 receives control signals RA, RB and RC outputted from the $13^{th}$ to $15^{th}$ flip-flops and selects one of them in response to the plurality of output selection signals A, B and C outputted from the selector 1450. Then, the $16^{th}$ to $18^{th}$ flip-flops outputs some of the plurality of delayed output enable signals, e.g., OE70 synchronized with the rising DLL clock RCLK_DLL.

Likewise, through the third MUX and the $8^{th}$ to $12^{th}$ flip-flops, the other of the plurality of delayed output enable signals, e.g., OE65 are output synchronized with the falling DLL clock FCLK_DLL.

Figure 16A:
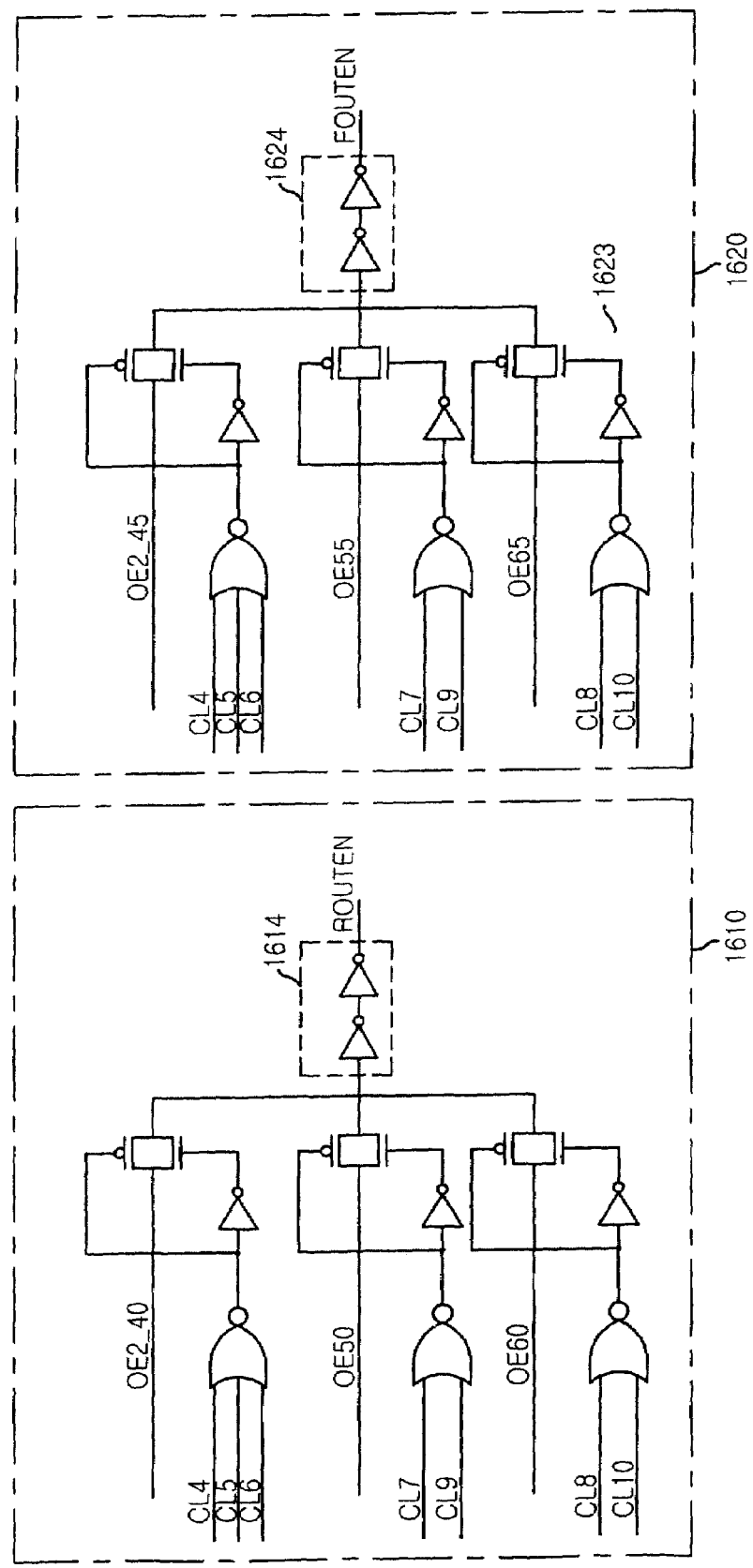
FIGS. 16A and 16B are block diagrams describing a data output controller in the domain crossing circuit shown in FIG. 9.
Figure 16B:
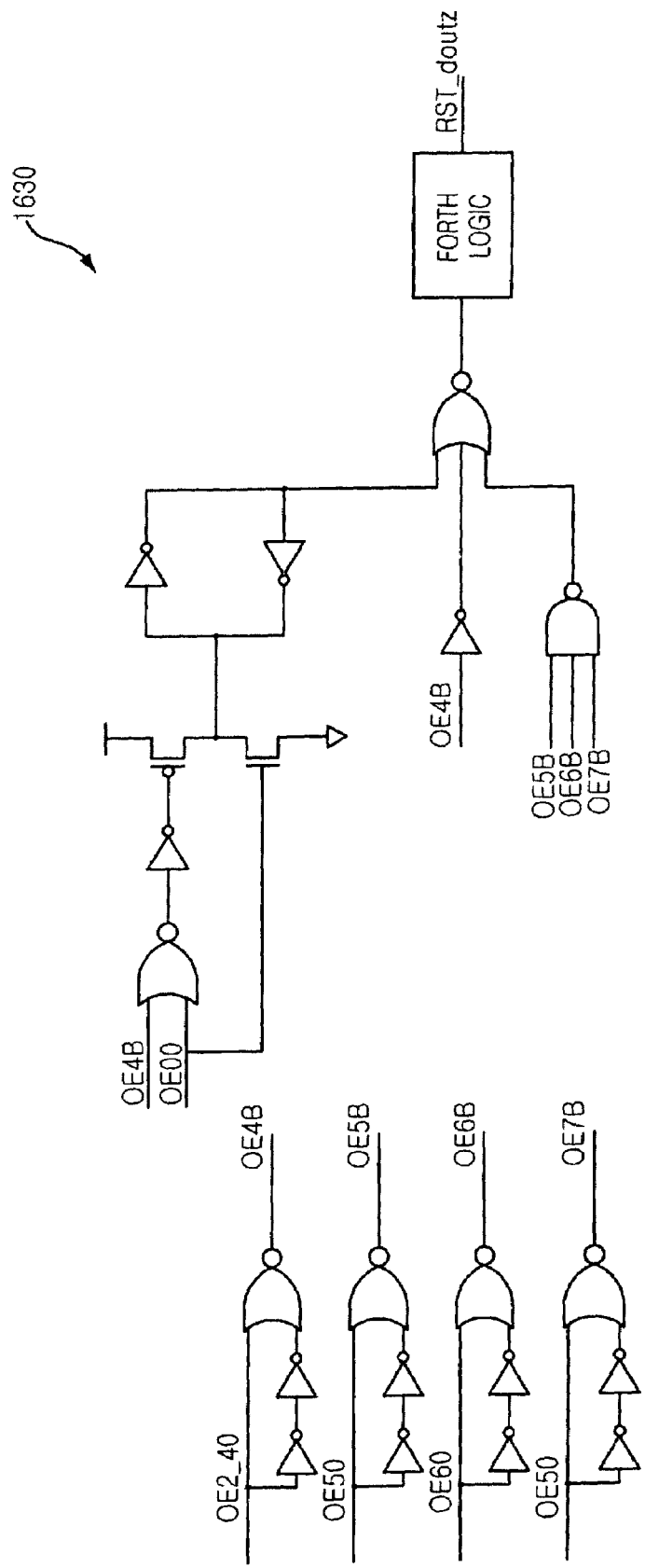

FIGS. 16A and 16B are block diagrams describing the data output controller 950 in the domain crossing circuit shown in FIG. 9.

The data output controller 950 includes a rising output enable signal generator 1610, a falling output enable signal generator 1620 and an output reset signal generator 1630.

The rising output enable signal generator 1610 receives some of the plurality of delayed output enable signals, e.g., OE60 synchronized with the rising DLL clock RCLK_DLL and selects one of them in response to the CAS latency, e.g., CL8. The selected signal is delayed by a block 1614 and, then, outputted as a rising output enable signal ROUTEN.

Namely, the data output controller 950 includes a plurality of enable signal generators for respectively receiving the plurality of delayed output enable signals, e.g., OE50 and individually generating the data strobe enable signal, i.e., output enable signal ROUTEN by transmitting one of the plurality of output enable signals in response to a modified CAS latency, wherein the modified CAS latency results from a NOR operation on at least two CAS latencies, e.g., CL7 and CL9.

Likewise, the falling output enable signal generator 1620 receives the others of the plurality of delayed output enable signals, e.g., OE55 synchronized with the falling DLL clock FCLK_DLL and selects one of them in response to the CAS latency, e.g., CL7. The selected signal is delayed by a block 1624 and, then, output as a falling output enable signal FOUTEN.

The output reset signal generator 1630 receives the initial output enable signal OE00 and some of the plurality of delayed output enable signals, e.g., OE60 synchronized with the rising DLL clock RCLK_DLL. Then, the output reset signal generator 1630 outputs a data output reset signal RST_douz through a logical operation shown in FIG. 16B.

Figure 17:
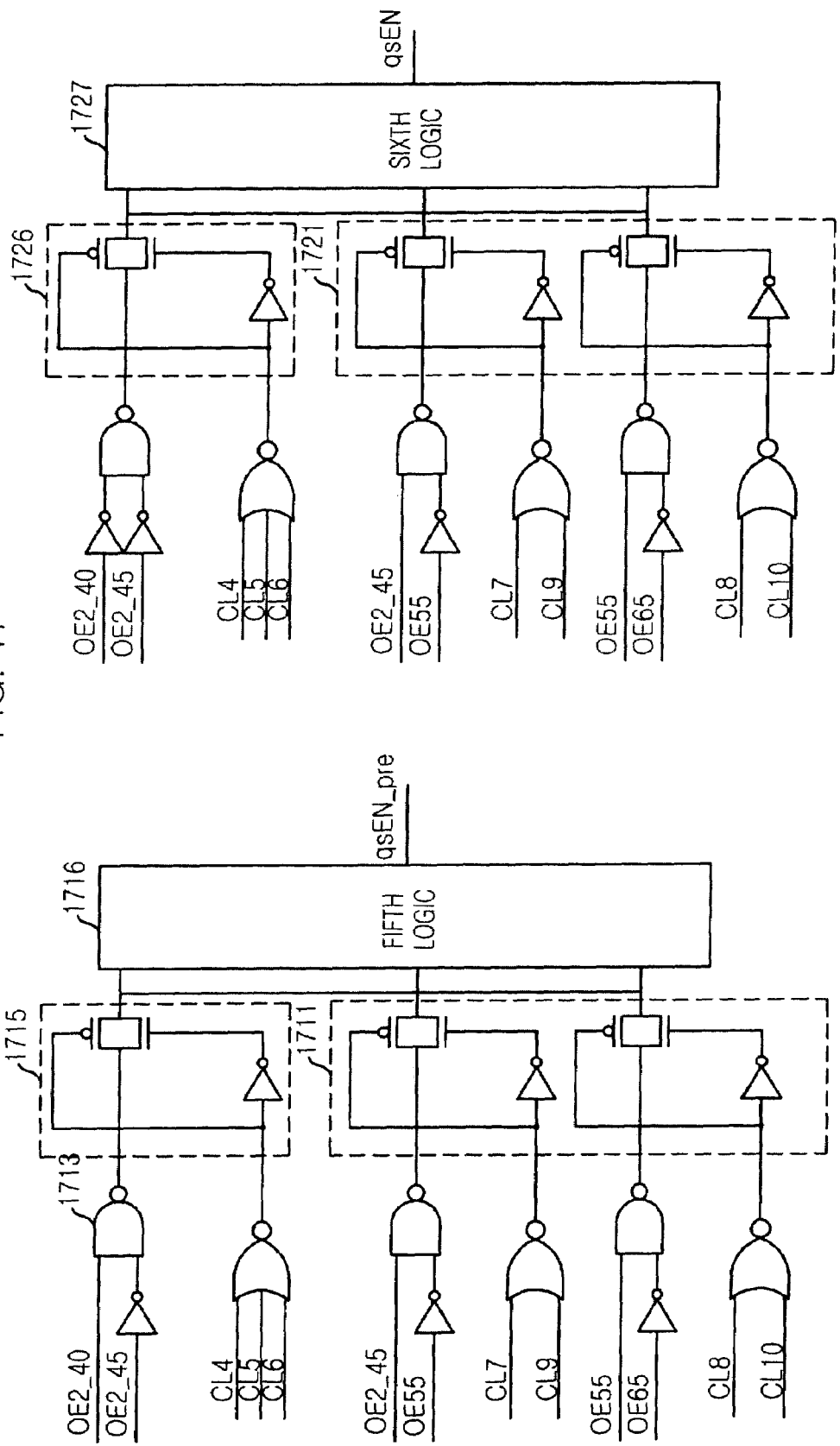
FIG. 17 is a block diagram describing a data controller in the domain crossing circuit shown in FIG. 9.

FIG. 17 is a block diagram describing the data controller 940 in the domain crossing circuit shown in FIG. 9.

As shown, the data controller 940 receives some of the plurality of delayed output enable signals, e.g., OE2_45 outputted from the second output enable signal generator 930. Then, using each two delayed output enable signals, e.g., OE55 and /OE65, a plurality of enable control signals are generated by each NAND gate, e.g., 1713.

Namely, the data controller 940 includes a plurality of enable control signal generators for respectively receiving the plurality of delayed output enable signals, e.g., OE2_45 and individually generating the data enable signal by transmitting one of the plurality of output enable signals in response to a modified CAS latency, wherein the modified CAS latency is resulted from NOR operation of at least two CAS latencies, e.g., CL7 and CL9.

Thereafter, first to fourth transmission blocks 1715, 1711, 1726 and 1721 respectively deliver the plurality of enable control signals in response to the CAS latency. Then, fifth and sixth logics 1716 and 1727 outputs a pre data enable signal qsEN_pre and a data enable signal qsEN. Herein, the data enable signal qsEN determines a valid period of an outputted data.

Figure 18:
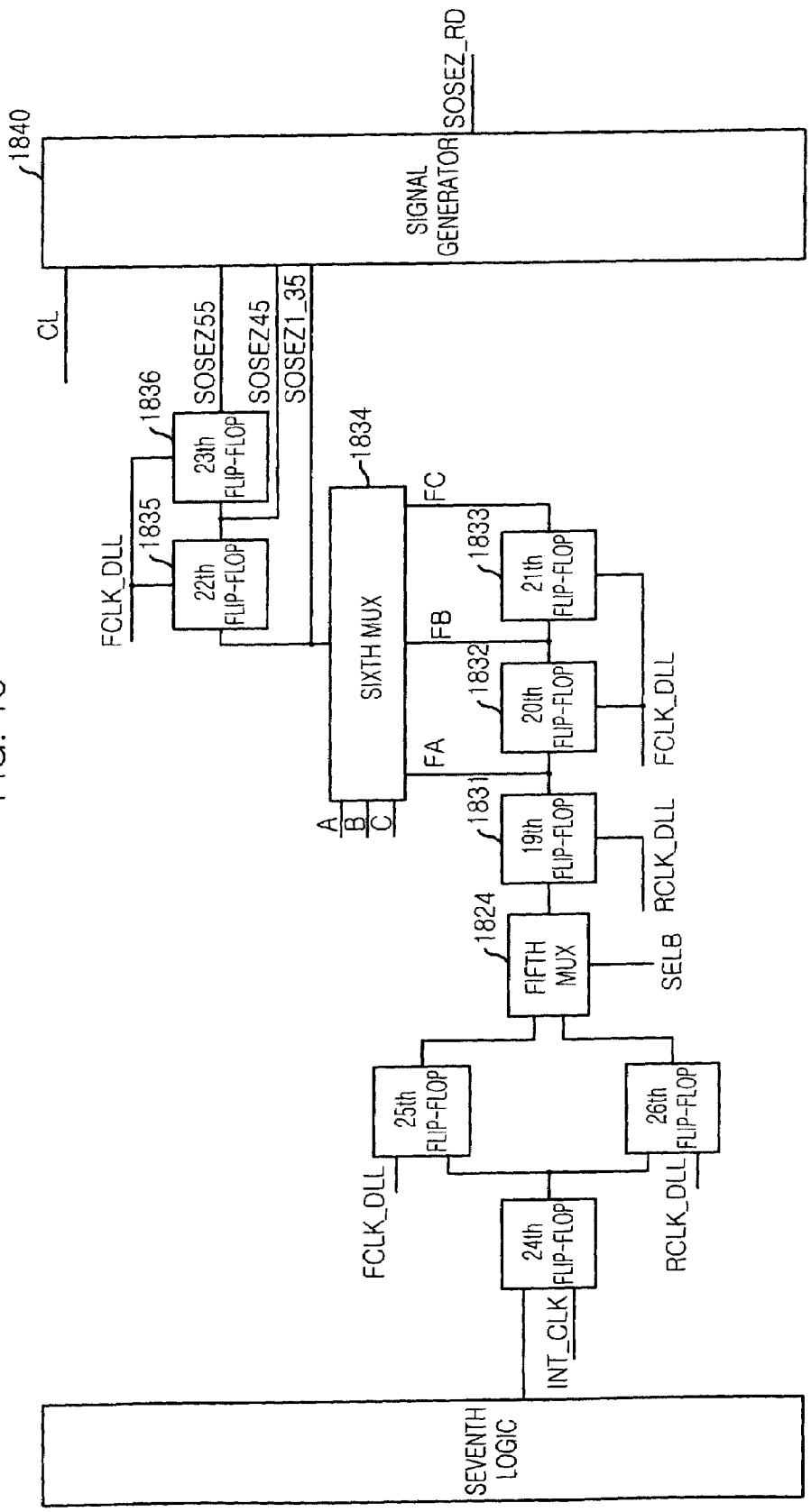
FIG. 18 is a schematic circuit diagram showing a first data align signal generator in the domain crossing circuit shown in FIG. 9.

FIG. 18 is a schematic circuit diagram showing the first data align signal generator 960 in the domain crossing circuit shown in FIG. 9. Herein, since the first and second data align signal generators 960 and 970 shown in FIG. 9 have the same structure, a description about the second data align signal generator 970 is omitted.

As described above, the first data align signal generator 960 receives a first address ADD0 and generates a first data align signal which aligns the input data in response to the first address ADD0 and the detection result of the domain crossing sensing block 920.

As shown, the first data align signal generator 960 includes a fifth MUX 1824, a sixth MUX 1834, a fifth flip-flop 1831, sixth to seventh flip-flop groups and a signal generator 1840.

The fifth MUX 1824 selects one of the rising and falling DLL clock signals RCLK_DLL and FCLK_DLL in response to the setup selection signal SELB. Then, the fifth flip-flop 1831 receives an output signal from the first MUX 1824 at an input terminal, the rising DLL clock signal RCLK_DLL at a clock terminal and the sensing start signal STARTZ at a reset terminal and synchronizing the output signal from the fifth MUX 1824 with the rising DLL clock signal RCLK_DLL.

The sixth flip-flop group 1832 and 1833 receives the output signal FA from the fifth flip-flop 1831, wherein the sixth flip-flop group 1832 and 1833 has a plurality of flip-flops which receive respectively the falling DLL clock signal FCLK_DLL at a clock terminal, the sensing start signal STARTZ at a reset terminal and an output signal of the last flip-flop at an input terminal. Then, each flip-flop generates individually pre-align control signal, e.g., FB synchronized with the falling DLL clock signal FCLK_DLL.

The sixth MUX 1834 selects one among an output signal FA from the first flip-flip and the pre-align control signals FB and FC in response to the plurality of output selection signals A, B and C.

The seventh flip-flop group 1835 and 1836 receives an output signal SOSEZ1_35 from the second MUX 1834, wherein the seventh flip-flop group 1835 and 1836 has a plurality of flip-flops which receive respectively the falling DLL clock signal FCLK_DLL at a clock terminal, the sensing start signal STARTZ at a reset terminal and an output signal of the last flip-flop at an input terminal. Then, each flip-flop generates individually align control signals SOSEZ45 and SOSEZ55 synchronized with the falling DLL clock signal FCLK_DLL.

The signal generator 1840 receives the output signal SOSEZ1_35 from the second MUX and the align control signals SOSEZ45 and SOSEZ55 and outputs the data align signal SOSEZ_RD in response to the CAS latency CL.

Figure 19:
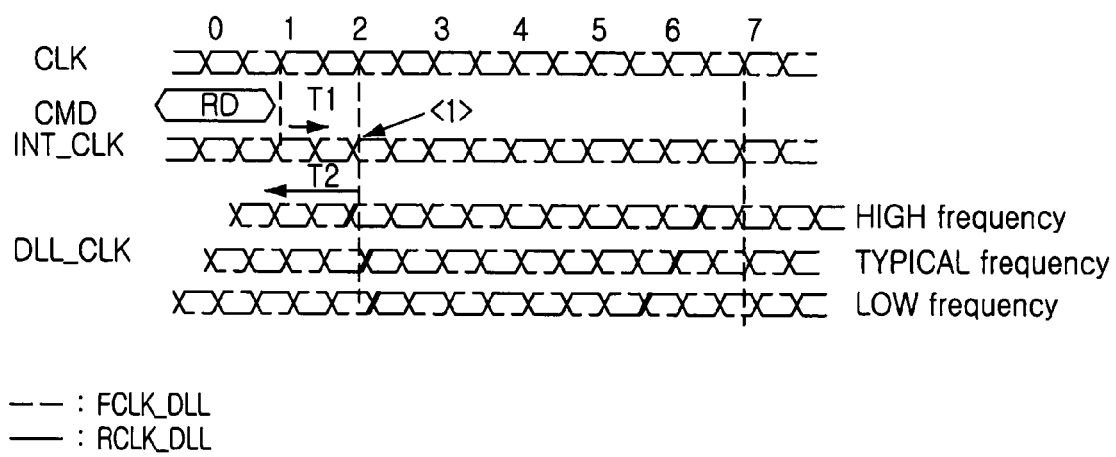
FIG. 19 is a timing diagram demonstrating an operation of the domain crossing circuit shown in FIG. 9.

FIG. 19 is a timing diagram demonstrating an operation of the domain crossing circuit shown in FIG. 9. Herein, it is assumed that the CAS latency is 7.

First, a read instruction RD is input at timing '0'. Then, at a predetermined timing <1> of the internal clock INT_CLK, the phase detector 1020 senses a phase of the rising or falling DLL clock signal RCLK_DLL or FCLK_DLL. Herein, the predetermined timing <1> is for guaranteeing a setup time of the domain crossing circuit after a data is inputted. The predetermined timing <1> is determined based on a circumstance such a high frequency, a low power voltage, a temperature, a complex process and the like.

For instance, referring to FIG. 19, when an operation frequency of the domain crossing circuit is high, the phase detector 1020 senses the falling DLL clock signal FCLK_DLL. In other case when the operation frequency is typical, the phase detector 1020 senses the rising DLL clock signal RCLK_DLL. Last, when the operation frequency is low, the phase detector 1020 senses the falling DLL clock signal FCLK_DLL.

Figure 20A:
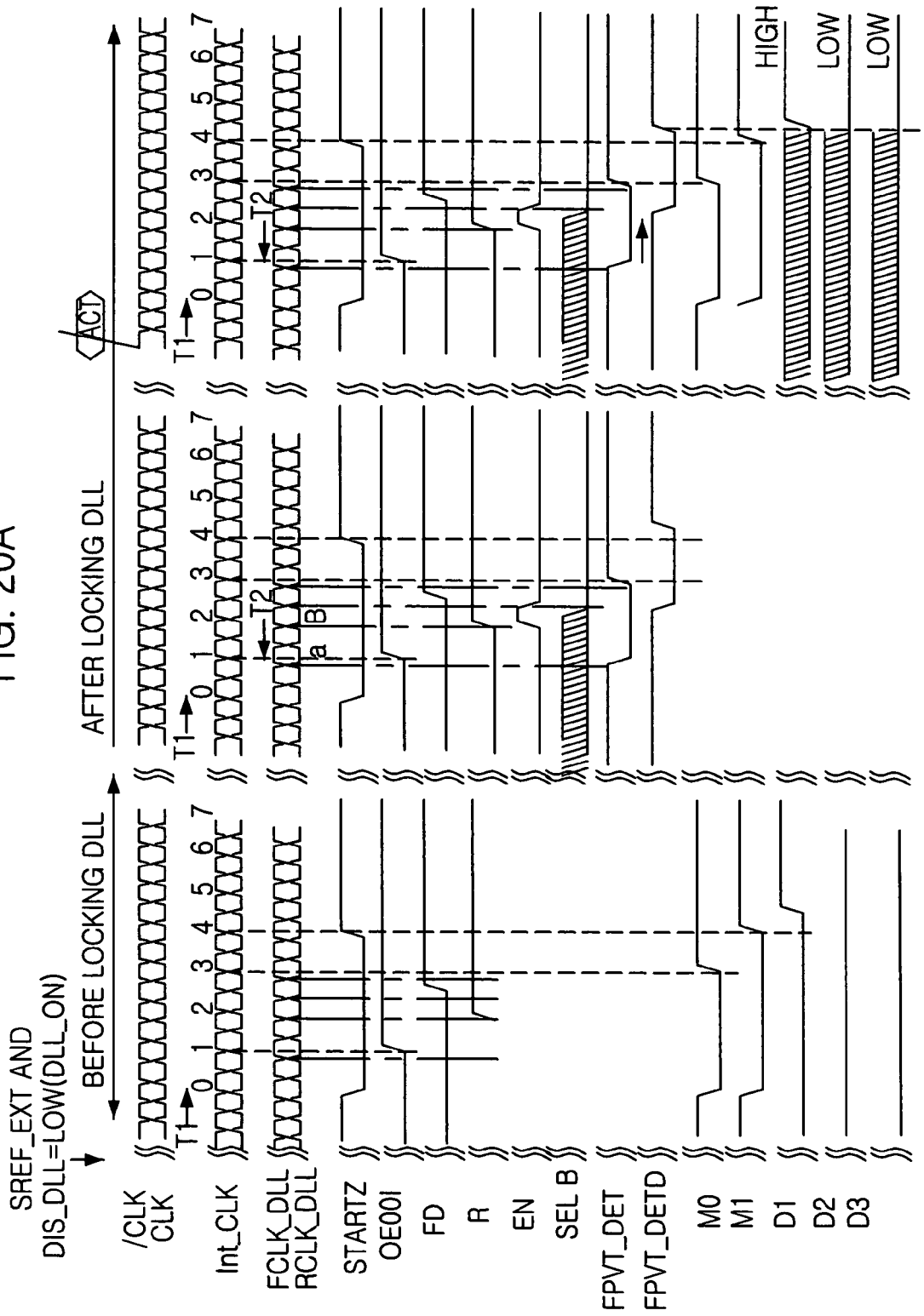
FIGS. 20A and 20B are as an example timing diagrams demonstrating an operation of a semiconductor memory device including the domain crossing circuit shown in FIG. 9.
Figure 20B:
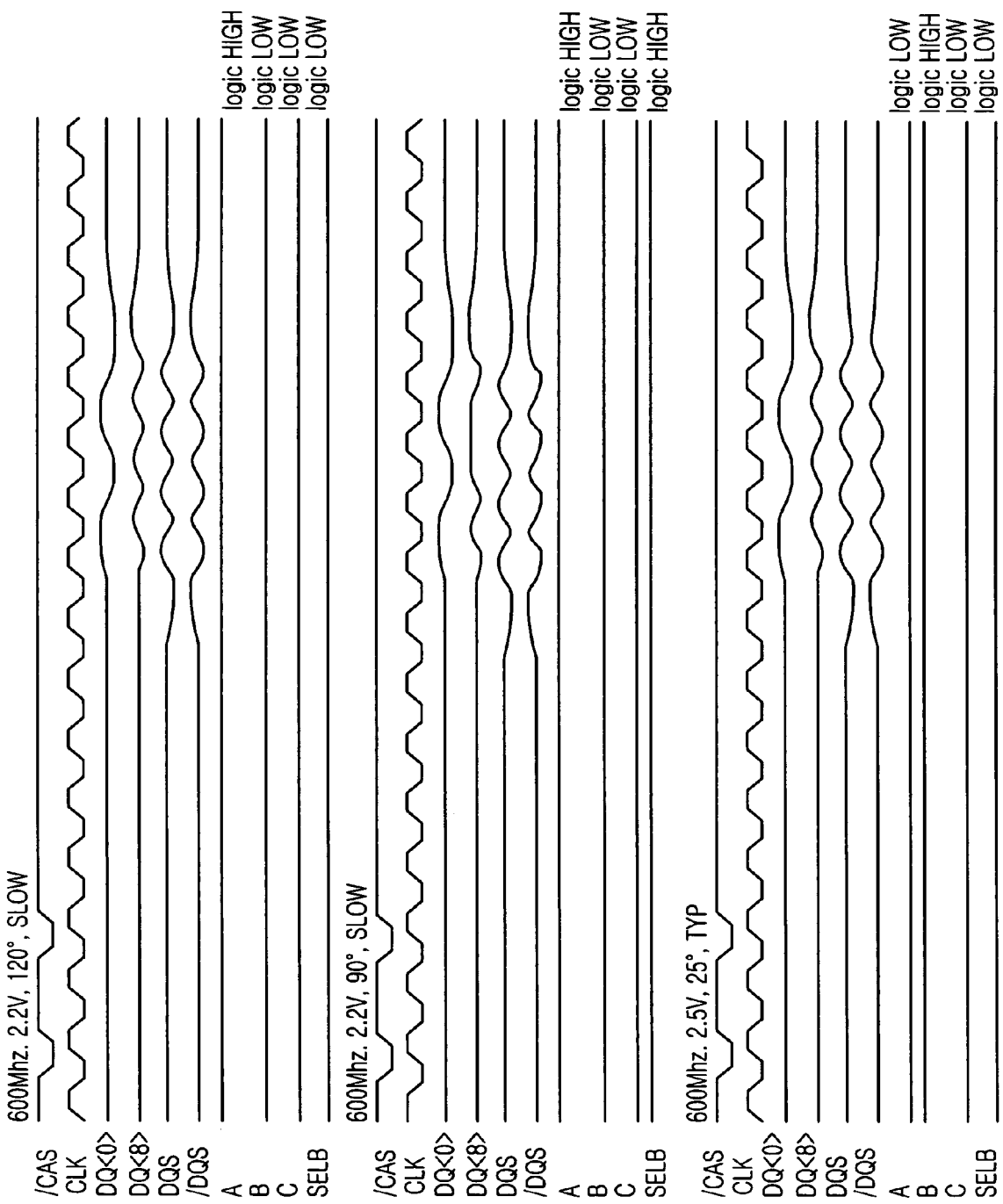

FIGS. 20A and 20B are as an example timing diagrams demonstrating an operation of a semiconductor memory device including the domain crossing circuit shown in FIG. 9.

Hereinafter, referring to FIG. 20A, the operation of the domain crossing circuit is described in detail.

First, the sensing start signal STARTZ becomes logic low level by the sensing control signal generator 1010. In the phase detector 1020, the first flip-flop 1211 outputs a logic high level output signal synchronized with a rising edge of the internal clock INT_CLK. Then, after the output signal of the first flip-flop 1211 is the logic high level, the output signal is detected at 'B' timing, not 'a' timing, because the setup time of the second and third flip-flops 1212 and 1213 is not guaranteed.

At this time, the output signal R of the third flip-flops 1213 is activated; and, then, the output signal F of the second flip-flops 1212 is activated. As a result, the setup selection signal SELB becomes a logic low level and the first MUX 431 outputs a selected one of the outputted signals R and F to the forth flip-flop 1241.

Thereafter, the reading path modeling block 100 receives an output signal FPVT_DET of the fourth flip-flop 1241 and outputs the phase detection signal FPVT_DETD after delaying it for the flight time.

Then, in the latency detector 1040, the phase detection signal FPVT_DETD is input to the delay block 1420 and converted into the first control signal EN. The flight timing sensing block 1430 receives the output signals M0 and M1 of the first flip-flop group 1410 and the first control signal EN and generates a plurality of plurality of flight detection signals D1 to D3 in response to the outputted signals M0 and M1.

Referring to FIG. 20B, there are timing diagrams describing an operation of the domain crossing circuit in three cases corresponding to the operation frequency, the power voltage and the temperature.

Consequently, the domain crossing circuit of the present invention can operate stably under various circumstance by using the plurality of output enable signals generated from the second output enable signal generator 930.

In addition, the domain crossing circuit in accordance with the present invention can detect a minute phase difference between an internal clock and a delay locked loop (DLL) clock and sense a flight time when the DLL clock passes from a DLL clock generator to a data output driver. Then, in response to the phase difference and the flight time, the domain crossing circuit can protect against an abnormal operation of the semiconductor system resulting from a high frequency, a low power voltage, a high temperature, a complex process and the like.

While the present invention has been described with respect to the particular embodiments, it will be apparent to those skilled in the art that various changes and modifications may be made without departing from the spirit and scope of the invention as defined in the following claims.

What is claimed is:

1. An apparatus, for use in a semiconductor device, for providing a domain crossing operation, comprising:
   a domain crossing sensing block in response to a operation mode signal, first and second delay locked loop (DLL) clock signals and a CAS latency for generating a plurality of selection signals;
   an output enable signal generator in response to the plurality of selection signals for generating a plurality of output enable signals;
   a data control block in response to the output enable signals and the CAS latency for controlling a data output operation in the semiconductor device; and
   a plurality of data align block, each in response to the selection signals, the first and second DLL clock signals and an address signal for aligning data corresponding to the address signal in the data output operation.

2. The apparatus as recited in claim 1, wherein the operation mode signal includes a refresh state signal, a DLL disable signal and a RAS idle signal.

3. The apparatus as recited in claim 2, wherein the domain crossing sensing block includes:
   a sensing control signal generator for generating a sensing start signal in response to the refresh state signal, the DLL disable signal and the RAS idle signal;
   a phase detector for comparing the first DLL clock signal with the second DLL clock signal in response to the sensing start signal and generating one of the selection signals, which is activated during the CAS latency, and a phase detection signal, which decides a phase detection period, in response to the sensing start signal;
   a reading path modeling block for delaying the phase detection signal by a predetermined value, which is equal to a delay time occurred through data reading path, and generating a delayed phase detection signal; and
   a latency detector for comparing the delayed phase detection signal with the CAS latency synchronized with the internal clock and generating others of the selection signals.

4. The apparatus as recited in claim 3, wherein the phase detector includes:
   a first MUX for selecting one of the first and second DLL clock signals in response to the setup selection signal; and
   a flip-flop for receiving an output signal from the first MUX at an input terminal, the first DLL clock signal at a clock terminal and the sensing start signal at a reset terminal.

5. The apparatus as recited in claim 3, wherein the latency detector includes:
   a flip-flop block having a plurality of flip-flops, each receiving the internal clock at a clock terminal, the sensing start signal at a reset terminal and a supply voltage at an input terminal, for generating first and second delay sensing signals;
   a delay block for delaying the sensing start signal;
   a flight timing sensing block for generating a plurality of flight detection signals in response to the first and second delay sensing signals; and
   a selector for outputting the plurality of output enable signals in response to the plurality of flight detection signals.

6. The apparatus as recited in claim 1, wherein the output enable signal generator includes:
   a first output enable signal generator for generating an initialization signal synchronized with an internal clock in response to a read instruction; and
   a second output enable signal generator for generating the enable signals by delaying the initialization signal based on the selection signals.

7. The apparatus as recited in claim 6, wherein the second output enable signal generator includes:
   a selection block for receiving the initialization signal and selecting one of first and second initialization signals synchronized with the first and second DLL clock signals in response to the selection signal;
   a first generating block in response to the first DLL clock signal for generating some of the enable signals based on the selected initialization signal; and
   a second generating block in response to the second DLL clock signal for generating the other of the enable signals based on the selected initialization signal.

8. The apparatus as recited in claim 7, wherein the selection block includes a MUX.

9. The apparatus as recited in claim 8, wherein the selection block includes a flip-flop for receiving an output signal from the MUX at an input terminal, the first DLL clock signal at a clock terminal and the selection signal at a reset terminal and synchronizing the output signal from the first MUX with the first DLL clock signal.

10. The apparatus as recited in claim 7, wherein the first generating block includes:
    a first flip-flop group for receiving an output signal from the selection block, wherein the first flip-flop group has a plurality of flip-flops which receive respectively the first DLL clock signal at a clock terminal, the selection signal at a reset terminal and an output signal of the last flip-flop at an input terminal and generate individually first control signals synchronized with the first DLL clock signal;
    a MUX for selecting one of first control signals in response to the selection signals; and a second flip-flop group for receiving an output signal from the MUX and generating the enable signals.

11. The apparatus as recited in claim 7, wherein the second generating block includes:
a first flip-flop group for receiving an output signal from the selection block, wherein the first flip-flop group has a plurality of flip-flops which receive respectively the second DLL clock signal at a clock terminal, the selection signal at a reset terminal and an output signal of the last flip-flop at an input terminal and generate individually second control signals synchronized with the second DLL clock signal;
a MUX for selecting one of second control signals in response to the selection signals; and
a second flip-flop group for receiving an output signal from the MUX and generating the enable signals.

12. The apparatus as recited in claim 1, wherein the data control block includes:
a data controller for receiving the enable signals and generating a data enable signal deciding a valid period of an outputted data; and
a data output controller for receiving the output enable signals and generating a data strobe enable signal deciding an active period of a data strobe signal.

13. The apparatus as recited in claim 12, wherein the data output controller includes:
a plurality of enable signal generators for respectively receiving the enable signals and individually generating the data strobe enable signal by transmitting one of the enable signals in response to a modified CAS latency,
wherein the modified CAS latency is resulted from NOR operation of at least two CAS latencies.

14. The apparatus as recited in claim 12, wherein the data controller includes:
a plurality of control signal generators for respectively receiving the enable signals and individually generating the data enable signal by transmitting one of the enable signals in response to a modified CAS latency, wherein the modified CAS latency is resulted from NOR operation of at least two CAS latencies.

15. The apparatus as recited in claim 1, wherein the align block includes:
a first generating block in response to the first and second DLL clock signal for generating a plurality of align initial signals based on the address signal; and
a second generating block in response to the selection signal for generating a data align signal based on the align initial signals.

16. The apparatus as recited in claim 15, wherein the first generating block includes:
a MUX for selecting one of the first and second DLL clock signals in response to the selection signal;
a first flip-flop for receiving an output signal from the MUX at an input terminal and the first DLL clock signal at a clock terminal and synchronizing the output signal from the MUX with the first DLL clock signal to output one of the align initial signal; and
a second flip-flop group for receiving the output signal from the first flip-flop, wherein the second flip-flop group has a plurality of flip-flops which receive respectively the second DLL clock signal at a clock terminal and an output signal of the last flip-flop at an input terminal and individually generate the other of the align initial signals synchronized with the second DLL clock signal.

17. The apparatus as recited in claim 15, wherein the second generating block includes:
a MUX for selecting one among the align initial signals in response to the selection signals;
a flip-flop group for receiving an output signal from the MUX, wherein the flip-flop group has a plurality of flip-flops which receive respectively the second DLL clock signal at a clock terminal and an output signal of the last flip-flop at an input terminal and generate individually align control signals synchronized with the second DLL clock signal; and
a signal generator for receiving the output signal from the MUX and the align control signals and outputting the data align signal in response to the CAS latency.

18. A semiconductor device for providing a domain crossing operation, comprising:
a domain crossing sensing block in response to an operation mode signal, first and second delay locked loop (DLL) clock signals and a CAS latency, generating a plurality of selection signals;
an output enable signal generator in response to the plurality of selection signals, generating a plurality of output enable signals;
a data control block in response to the output enable signals and the CAS latency, controlling a data output operation in the semiconductor device; and
a plurality of data align block, each in response to the selection signals, the first and second DLL clock signals and an address signal, aligning data corresponding to the address signal in the data output operation.

19. The semiconductor device as recited in claim 18, wherein the operation mode signal includes a refresh state signal, a DLL disable signal and a RAS idle signal.

20. The semiconductor device as recited in claim 19, wherein the domain crossing sensing block includes:
a sensing control signal generator for generating a sensing start signal in response to the refresh state signal, the DLL disable signal and the RAS idle signal;
a phase detector for comparing the first DLL clock signal with the second DLL clock signal in response to the sensing start signal and generating one of the selection signals, which is activated during the CAS latency, and a phase detection signal, which decides a phase detection period, in response to the sensing start signal;
a reading path modeling block for delaying the phase detection signal by a predetermined value, which is equal to a delay time occurred through data reading path, and generating a delayed phase detection signal; and
a latency detector for comparing the delayed phase detection signal with the CAS latency synchronized with the internal clock and generating others of the selection signals.

21. The semiconductor device as recited in claim 20, wherein the phase detector includes:
a first MUX for selecting one of the first and second DLL clock signals in response to the setup selection signal; and
a flip-flop for receiving an output signal from the first MUX at an input terminal, the first DLL clock signal at a clock terminal and the sensing start signal at a reset terminal.

22. The semiconductor device as recited in claim 20, wherein the latency detector includes:
a flip-flop block having a plurality of flip-flops, each receiving the internal clock at a clock terminal, the sensing start signal at a reset terminal and a supply voltage at an input terminal, for generating first and second delay sensing signals;

a delay block for delaying the sensing start signal;

a flight timing sensing block for generating a plurality of flight detection signals in response to the first and second delay sensing signals; and a selector for outputting the plurality of output enable signals in response to the plurality of flight detection signals.

23. The semiconductor device as recited in claim 18, wherein the output enable signal generator includes:

a first output enable signal generator for generating an initialization signal synchronized with an internal clock in response to a read instruction; and a second output enable signal generator for generating the enable signals by delaying the initialization signal based on the selection signals.

24. The semiconductor device as recited in claim 23, wherein the second output enable signal generator includes:

a selection block for receiving the initialization signal and selecting one of first and second initialization signals synchronized with the first and second DLL clock signals in response to the selection signal;

a first generating block in response to the first DLL clock signal for generating some of the enable signals based on the selected initialization signal; and a second generating block in response to the second DLL clock signal for generating the other of the enable signals based on the selected initialization signal.

25. The semiconductor device as recited in claim 24, wherein the selection block includes a MUX.

26. The semiconductor device as recited in claim 25, wherein the selection block includes a flip-flop for receiving an output signal from the MUX at an input terminal, the first DLL clock signal at a clock terminal and the selection signal at a reset terminal and synchronizing the output signal from the first MUX with the first DLL clock signal.

27. The semiconductor device as recited in claim 24, wherein the first generating block includes:

a first flip-flop group for receiving an output signal from the selection block, wherein the first flip-flop group has a plurality of flip-flops which receive respectively the first DLL clock signal at a clock terminal, the selection signal at a reset terminal and an output signal of the last flip-flop at an input terminal and generate individually first control signals synchronized with the first DLL clock signal;

a MUX for selecting one of first control signals in response to the selection signals; and a second flip-flop group for receiving an output signal from the MUX and generating the enable signals.

28. The semiconductor device as recited in claim 24, wherein the second generating block includes:

a first flip-flop group for receiving an output signal from the selection block, wherein the first flip-flop group has a plurality of flip-flops which receive respectively the second DLL clock signal at a clock terminal, the selection signal at a reset terminal and an output signal of the last flip-flop at an input terminal and generate individually second control signals synchronized with the second DLL clock signal;

a MUX for selecting one of second control signals in response to the selection signals; and a second flip-flop group for receiving an output signal from the MUX and generating the enable signals.

29. The semiconductor device as recited in claim 18, wherein the data control block includes:

a data controller for receiving the enable signals and generating a data enable signal deciding a valid period of an outputted data; and a data output controller for receiving the output enable signals and generating a data strobe enable signal deciding an active period of a data strobe signal.

30. The semiconductor device as recited in claim 29, wherein the data output controller includes:

a plurality of enable signal generators for respectively receiving the enable signals and individually generating the data strobe enable signal by transmitting one of the enable signals in response to a modified CAS latency, wherein the modified CAS latency is resulted from NOR operation of at least two CAS latencies.

31. The semiconductor device as recited in claim 29, wherein the data controller includes:

a plurality of control signal generators for respectively receiving the enable signals and individually generating the data enable signal by transmitting one of the enable signals in response to a modified CAS latency, wherein the modified CAS latency is resulted from NOR operation of at least two CAS latencies.

32. The semiconductor device as recited in claim 18, wherein the align block includes:

a first generating block in response to the first and second DLL clock signal for generating a plurality of align initial signals based on the address signal; and a second generating block in response to the selection signal for generating a data align signal based on the align initial signals.

33. The semiconductor device as recited in claim 32, wherein the first generating block includes:

a MUX for selecting one of the first and second DLL clock signals in response to the selection signal;

a first flip-flop for receiving an output signal from the MUX at an input terminal and the first DLL clock signal at a clock terminal and synchronizing the output signal from the MUX with the first DLL clock signal to output one of the align initial signal; and a second flip-flop group for receiving the output signal from the first flip-flop, wherein the second flip-flop group has a plurality of flip-flops which receive respectively the second DLL clock signal at a clock terminal and an output signal of the last flip-flop at an input terminal and individually generate the other of the align initial signals synchronized with the second DLL clock signal.

34. The semiconductor device as recited in claim 32, wherein the second generating block includes:

a MUX for selecting one among the align initial signals in response to the selection signals;

a flip-flop group for receiving an output signal from the MUX, wherein the flip-flop group has a plurality of flip-flops which receive respectively the second DLL clock signal at a clock terminal and an output signal of the last flip-flop at an input terminal and generate individually align control signals synchronized with the second DLL clock signal; and a signal generator for receiving the output signal from the MUX and the align control signals and outputting the data align signal in response to the CAS latency.

* * * * *